(12) United States Patent
Dewey et al.

(10) Patent No.: US 11,843,058 B2
(45) Date of Patent: *Dec. 12, 2023

(54) TRANSISTOR STRUCTURES WITH A METAL OXIDE CONTACT BUFFER AND A METHOD OF FABRICATING THE TRANSISTOR STRUCTURES

(71) Applicant: Intel Corporation, Santa Clara, CA (US)

(72) Inventors: Gilbert Dewey, Hillsboro, OR (US); Abhishek Sharma, Hillsboro, OR (US); Van Le, Beaverton, OR (US); Jack Kavalieros, Portland, OR (US); Shriram Shivaraman, Hillsboro, OR (US); Seung Hoon Sung, Portland, OR (US); Tahir Ghani, Portland, OR (US); Arnab Sen Gupta, Beaverton, OR (US); Nazila Haratipour, Hillsboro, OR (US); Justin Weber, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/516,569

(22) Filed: Nov. 1, 2021

(65) Prior Publication Data
US 2022/0052200 A1   Feb. 17, 2022

Related U.S. Application Data

(63) Continuation of application No. 16/455,581, filed on Jun. 27, 2019, now Pat. No. 11,171,243.

(51) Int. Cl.
*H01L 29/786* (2006.01)
*H01L 21/8238* (2006.01)
(Continued)

(52) U.S. Cl.
CPC .. *H01L 29/7869* (2013.01); *H01L 21/823807* (2013.01); *H01L 27/092* (2013.01); *H01L 29/221* (2013.01); *H01L 29/78696* (2013.01)

(58) Field of Classification Search
CPC ........... H01L 29/7869; H01L 29/78696; H01L 29/66969; H01L 29/221; H01L 21/8258;
(Continued)

(56) References Cited

U.S. PATENT DOCUMENTS

| 6,140,672 A | 10/2000 | Arita et al. |
| 6,339,241 B1 | 1/2002 | Mandelman et al. |

(Continued)

FOREIGN PATENT DOCUMENTS

| KR | 20100053230 | 5/2010 |
| WO | 2018182607 | 10/2018 |

OTHER PUBLICATIONS

Final Office Action from U.S. Appl. No. 16/455,581 dated Mar. 12, 2021, 19 pgs.
(Continued)

*Primary Examiner* — Khiem D Nguyen
(74) *Attorney, Agent, or Firm* — Essential Patents Group, LLP

(57) ABSTRACT

Transistor structures may include a metal oxide contact buffer between a portion of a channel material and source or drain contact metallization. The contact buffer may improve control of transistor channel length by limiting reaction between contact metallization and the channel material. The channel material may be of a first composition and the contact buffer may be of a second composition.

18 Claims, 12 Drawing Sheets

(51) Int. Cl.
*H01L 27/092* (2006.01)
*H01L 29/221* (2006.01)

(58) Field of Classification Search
CPC ........... H01L 21/823807; H01L 27/092; H01L 27/1225; H01L 27/0922
USPC ........................................................ 257/43
See application file for complete search history.

(56) References Cited

U.S. PATENT DOCUMENTS

| | | | |
|---|---|---|---|
| 6,392,917 | B1 | 5/2002 | Kang |
| 6,404,667 | B1 | 6/2002 | Yoo |
| 6,700,133 | B1 | 3/2004 | Ohtani et al. |
| 6,873,029 | B2 | 3/2005 | He et al. |
| 7,919,800 | B2 | 4/2011 | Gonzalez et al. |
| 8,258,498 | B2 | 9/2012 | Majhi et al. |
| 8,395,191 | B2 | 3/2013 | Or-Bach et al. |
| 9,263,527 | B2 | 2/2016 | Yamada et al. |
| 9,576,960 | B2 | 2/2017 | Khakifirooz et al. |
| 9,673,285 | B2* | 6/2017 | Simin ..................... G06F 30/39 |
| 9,705,003 | B2* | 7/2017 | Yamazaki ........... H01L 27/1225 |
| 9,991,268 | B1 | 6/2018 | Liaw |
| 10,026,845 | B2* | 7/2018 | Pillarisetty ........ H01L 29/78618 |
| 10,084,058 | B2* | 9/2018 | Majhi ................... H01L 29/517 |
| 10,224,279 | B2 | 3/2019 | Or-Bach et al. |
| 10,312,289 | B1 | 6/2019 | Ota et al. |
| 11,171,243 | B2* | 11/2021 | Dewey ................ H01L 27/0922 |
| 11,282,963 | B2 | 3/2022 | Ahmed |
| 11,355,505 | B2 | 6/2022 | Morris et al. |
| 2003/0132470 | A1 | 7/2003 | Joshi et al. |
| 2005/0236622 | A1 | 10/2005 | Jung et al. |
| 2007/0155067 | A1 | 7/2007 | Park et al. |
| 2009/0146141 | A1 | 6/2009 | Song et al. |
| 2010/0038743 | A1 | 2/2010 | Lee |
| 2010/0110758 | A1 | 5/2010 | Li et al. |
| 2010/0224873 | A1* | 9/2010 | Sakata ............. H01L 21/02565 257/E29.296 |
| 2011/0121266 | A1 | 5/2011 | Majhi et al. |
| 2011/0168993 | A1 | 7/2011 | Jeon et al. |
| 2012/0003808 | A1 | 1/2012 | Lee |
| 2012/0319728 | A1* | 12/2012 | Madurawe .......... H01L 27/1116 326/38 |
| 2013/0264620 | A1 | 10/2013 | Yu et al. |
| 2013/0292702 | A1 | 11/2013 | Horii |
| 2014/0009998 | A1 | 1/2014 | Schloss et al. |
| 2014/0145272 | A1 | 5/2014 | Or-Bach et al. |
| 2014/0183637 | A1 | 7/2014 | Cohen et al. |
| 2015/0179786 | A1 | 6/2015 | Kim et al. |
| 2015/0249096 | A1 | 9/2015 | Lupino et al. |
| 2015/0255139 | A1* | 9/2015 | Atsumi ............... H01L 29/7869 257/43 |
| 2015/0364565 | A1 | 12/2015 | Ramaswamy et al. |
| 2016/0043114 | A1* | 2/2016 | Mao ................... H01L 21/02422 438/166 |
| 2016/0056039 | A1 | 2/2016 | Kim et al. |
| 2016/0056249 | A1 | 2/2016 | Kleemeier et al. |
| 2016/0204277 | A1* | 7/2016 | Yang ................. H01L 29/66742 438/151 |
| 2016/0225915 | A1 | 8/2016 | Qiu et al. |
| 2016/0359062 | A1 | 12/2016 | Heo et al. |
| 2016/0365372 | A1 | 12/2016 | Li et al. |
| 2017/0133375 | A1 | 5/2017 | Fung |
| 2017/0162702 | A1 | 6/2017 | Hu |
| 2017/0200744 | A1 | 7/2017 | Giles et al. |
| 2017/0358598 | A1 | 12/2017 | Bedeschi |
| 2018/0130785 | A1 | 5/2018 | Wang et al. |
| 2018/0226248 | A1 | 8/2018 | Jahangir et al. |
| 2018/0226509 | A1* | 8/2018 | Karpov ............... H01L 27/0705 |
| 2019/0027535 | A1 | 1/2019 | Kumar et al. |
| 2019/0267319 | A1 | 8/2019 | Sharma et al. |
| 2019/0287858 | A1* | 9/2019 | Dasgupta ............ H01L 29/0847 |
| 2019/0371892 | A1 | 12/2019 | Lee et al. |
| 2020/0098564 | A1 | 3/2020 | Li et al. |
| 2020/0135921 | A1 | 4/2020 | Chiang |
| 2020/0258884 | A1 | 8/2020 | Rachmady et al. |
| 2020/0350440 | A1 | 11/2020 | Gao et al. |
| 2020/0357814 | A1 | 11/2020 | Kim et al. |

OTHER PUBLICATIONS

Non-Final Office Action from U.S. Appl. No. 16/455,581 dated Sep. 17, 2020, 14 pgs.
Notice of Allowance from U.S. Appl. No. 16/455,581 dated Jul. 19, 2021, 10 pgs.
Restriction Requirement from U.S. Appl. No. 16/455,581 dated Jul. 2, 2020, 6 pgs.
Kim, Se-Yang, et al., "Recent Developments in Controlled Vapor-Phase Growth of Two- Dimensional Group 6 Transition Metal Dichalcogenides", Advanced Materials, vol. 31, Issue 20, Feb. 2019, 90 pgs.
Zubko, P., et al., "Ferroelectric Domains in PbTiO3/SrTiO3 Superlattices", FERROELECTRICS, vol. 433, No. 1, Sep. 12, 2012, pp. 127-137.

* cited by examiner

TRANSISTOR STRUCTURES WITH A METAL OXIDE CONTACT BUFFER AND A METHOD OF FABRICATING THE TRANSISTOR STRUCTURES

CLAIM OF PRIORITY

This application is a Continuation of, and claims the benefit of priority to, U.S. patent application Ser. No. 16/455,581, filed on Jun. 27, 2019, issued as U.S. Pat. No. 11,171,243, and titled "TRANSISTOR STRUCTURES WITH A METAL OXIDE CONTACT BUFFER," which is incorporated by reference in entirety.

BACKGROUND

Many advanced semiconductor devices in development leverage non-crystalline silicon semiconductor materials. One class of those materials is oxide semiconductors (a.k.a. semiconducting oxides) having various compositions that include oxygen and one or more metals. One example of an oxide semiconductor is indium gallium zinc oxide (IGZO). Another class of semiconductor material is metal chalcogenides having various compositions including one or more metals and a chalcogen (e.g., S, Se, Te).

Demand for integrated circuits (ICs) in portable electronic applications has motivated greater levels of semiconductor device integration. A thin-film transistor (TFT) is a class of field-effect transistors (FETs) in which the channel material is a deposited thin film rather than a surface layer of a monocrystalline substrate material. Group IV materials (e.g., Si, Ge) have typically been employed in TFTs, but metal oxide semiconductors, and metal chalcogenide semiconductors are promising channel materials for TFTs. Because many such materials may be deposited at relatively low temperatures (e.g., below 450° C.), one or more device level of such transistors may be integrated monolithically with one or more other device levels that may include other FETs. Many thin film semiconductor materials however have been found to react with metallization, complicating the formation of source and drain contacts in a TFT structure.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
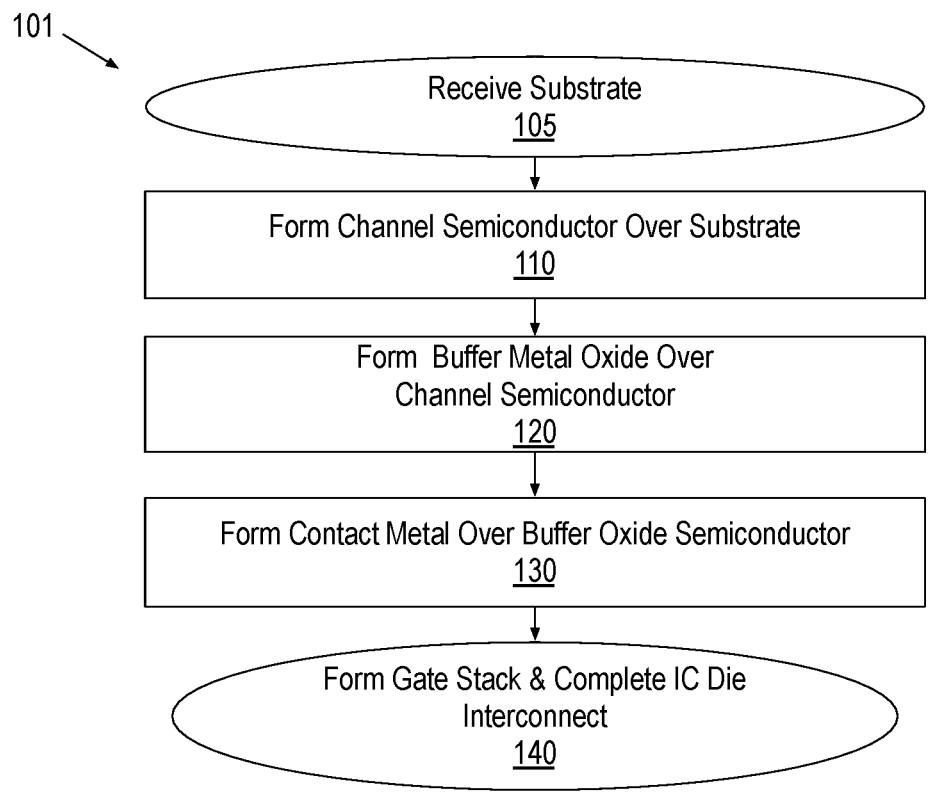
FIG. 1 is a flow diagram illustrating methods of fabricating transistor structures, in accordance with some embodiments.

One or more embodiments are described with reference to the enclosed figures.

While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are transistor structures employing an metal oxide contact buffer, and methods of fabricating transistor structures including such a contact buffer. FIG. 1 is a flow diagram illustrating fabrication methods 101, in accordance with some exemplary embodiments. Methods 101 begin at block 105 where a substrate is received. The substrate may advantageously include a monocrystalline semiconductor layer, such as a silicon layer, upon which front-end-of-line (FEOL) FETs may be fabricated, for example upstream of methods 101. In some embodiments, the substrate received may include FEOL FETs of any architecture that have been fabricated using any technique, and that are interconnected with one or more metallization levels to form FEOL circuitry. In some examples, the FEOL FETs include both n-type and p-type FETs interconnected into a CMOS FEOL circuit. Alternatively, the substrate received at block 105 may include back-end-of-line (BEOL) circuitry over which additional active devices may be formed.

At block 110, a channel material is formed over the substrate, for example as a thin film deposited by any technique suitable for a desired material composition and microstructure. For example, the channel material may be deposited by physical vapor deposition (PVD), chemical vapor deposition (CVD), or atomic layer deposition (ALD).

The channel material deposited at block 110 may have any composition that is suitable for a channel region of a transistor, and is therefore referred to herein as "channel material." The material deposited at block 110 may be a p-type, n-type, or intrinsic semiconductor material. The channel material deposited at block 110 may be monocrystalline, polycrystalline, or amorphous.

In some embodiments, the channel material deposited at block 110 comprises predominantly silicon, predominantly germanium, or is a group IV alloy (e.g., SiGe).). In other embodiments, the channel material deposited at block 100 is a Group III-N material (e.g., GaN, InN, InGaN). In still other embodiments, the channel material deposited at block 100 is graphene or black phosphorus. In other embodiments, the channel material deposited at block 110 is a metal chalcogenide. For example, any of $CuS_x$, $CuSe_x$, $CuTe_x$, $ZnS_x$, $ZnSe_x$, $ZnTe_x$, $ZrS_x$, $ZrSe_x$, $ZrTe_x$, $CrSe_x$, $CrTe_x$, $TiS_x$, $TiSe_x$, $TiTe_x$, $FeS_x$, $FeSe_x$, $TaS_x$, $TaSe_x$, $TaTe_x$, $CrS_x$, $CrSe_x$, $CrTe_x$, $VS_x$, $VSe_x$, $VTe_x$, $WS_x$, $WSe_x$, $WTe_x$, $MoS_x$, $MoSe_x$, $MoTe_x$, $InS_x$, $InSe_x$, $InTe_x$, $NbS_x$, $NbSe_x$, $NbTe_x$, $SnS_x$, $SnSe_x$, $SnTe_x$, $GeS_x$, $GeSe_x$, $GeTe_x$, $SiS_x$, $SiSe_x$, $SiTe_x$, $InGaZnS_x$ or $InGaZnSe_x$ may be deposited or otherwise formed at block 110. In other embodiments, the channel material deposited at block 110 is a Group III-V material, such as, but not limited to InGaAs, GaAs.

In other embodiments, the channel material deposited at block 110 is a metal oxide. Certain metal oxides are semiconducting and can have good transistor channel characteristics, for example offering high carrier mobility and a tunable material band gap and resistivity. The metal(s) may be a transition metal (e.g., IUPAC group 4-10) or post-transition metal (e.g., IUPAC groups 11-15). In advantageous embodiments, the metal oxide deposited at block 110 includes at least one of Mg, Cu, Zn, Sn, Ti, Ge, Si, Ga, In, or Ga. The metal oxides may be suboxides ($A_2O$), monoxides (AO), binary oxides ($AO_2$), ternary oxides ($ABO_3$), and mixtures thereof.

In some specific embodiments, the metal oxide deposited at block 110 comprises a tin oxide ($SnO_x$), such as Tin (IV) oxide, or $SnO_2$. In other embodiments, the tin oxide is Tin (II) oxide (SnO) or a mixture of SnO and $SnO_2$, where x may range between 1 and 2. While the range of x may be expanded, semiconducting properties may be lost (e.g., the material becomes a pure conductor if x is to low, and a pure insulator if x is too high). In some other embodiments, the metal oxide deposited at block 110 comprises a zinc oxide ($ZnO_x$), such as Zn(II) oxide, or ZnO. In other embodiments, the zinc oxide is zinc peroxide ($ZnO_2$) or a mixture of ZnO and $ZnO_2$, where x may range between 1 and 2. In some other embodiments, the metal oxide deposited at block 110 comprises titanium oxide ($TiO_x$). Exemplary metal oxides that may have suitable p-type conductivity include copper oxide ($CuO_x$). In some $CuO_x$ embodiments, the metal oxide deposited at block 110 is Cu(I) oxide, or $Cu_2O$. In other embodiments, metal oxide deposited at block 110 is Cu(II) oxide (CuO) or a mixture of CuO and $Cu_2O$, where x may range between 0.5 and 1.

The basis for n-type conductivity in many metal oxides may be the presence of oxygen vacancies. The presence of other electrically active dopants, such as hydrogen, or one or more metal species, may also serve as a means of tuning the semiconducting properties of the metal oxide deposited at block 110 so that the material is suitable as a transistor channel. Semiconductor oxide deposited at block 110 may be intentionally doped, or not. Compared to intrinsic metal oxide that is not intentionally doped, n-type and p-type metal oxides may have a higher concentration of impurities, such as, but not limited to, one or more group III element, group V element, and/or elemental hydrogen (H). Dopant levels in an metal oxide deposited at block 110 may be selected to arrive at optimal threshold voltage associated with gating the semiconducting metal oxide within a channel region of a transistor, for example. In some embodiments, the metal oxide material deposited at block 110 comprises $ZnO_x$ doped with In and Ga, for example. In some such embodiments, the metal oxide semiconductor material deposited at block 110 is $InGaO_3(ZnO)_5$, often referred to as IGZO.

Methods 101 continue at block 120 with formation of an metal oxide suitable as a contact buffer material, for example within a source region and/or a drain region of a transistor structure. The metal oxide formed at block 120 may again be deposited using any thin film deposition technique suitable for a desired material composition, such as, but not limited to, PVD, CVD, or ALD. As a contact buffer, the metal oxide deposited at block 120 is to be physically located between the channel material and any contact metallization that is subsequently formed at block 130. The metal oxide deposited at block 120 is to physically space apart the channel material from any source/drain contact metallization that may be prone to reacting with the channel material. The metal oxide deposited at block 120 is therefore referred to herein as a "contact buffer" material. The metal oxide buffer material may be deposited to a thickness of as little as 1 nm, for example, up to 10 nm, or more as a function of the reactivity of the contact metallization with the contact buffer material. For example, where contact metallization reacts with the contact buffer over a greater distance from the metallurgical interface, the contact buffer may be deposited to a greater thickness.

Although not bound by theory, it is currently thought that contact metallization may getter some impurity dopants with which the metallization is in contact. This is particularly true for metal oxide materials where oxygen concentration/vacancies act as impurity dopants. As noted above, a loss of oxygen from an metal oxide may increase oxygen deficiencies proximal to the contact metallization, and thereby locally increase the conductivity of metal oxide material. The distance from a metal-metal oxide junction over which conductivity is modified by the metallization may also be poorly controlled, and/or dependent on an initial ("as-deposited") composition of the metal oxide or processing environment. Reactivity between contact metallization and any interfacial semiconductor material may impact the transistor gate length ($L_g$) if the metallization is able to react with the channel material. The metal oxide deposited at block 120 as a buffer between channel material and metallization may improve transistor gate length control by containing, and/or otherwise stabilizing, the contact metallization metallurgical junction.

The contact buffer material deposited at block 120 may have any of the metal oxide compositions described above for channel semiconductor material. In some embodiments, the contact buffer material deposited at block 120 has the same composition as that of the channel material deposited at block 110. For such embodiments, the buffer metal oxide deposited a block 120 supplements the channel metal oxide deposited at block 110, for example to achieve a particular transistor structure, such as a localized raised or elevated source/drain structure, through additive fabrication techniques.

In accordance with some other embodiments, the contact buffer material deposited at block 120 has a composition distinct from that of the channel material deposited at block 110. For any of these embodiments, the buffer metal oxide deposited at block 120 may provide a particular transistor structure (e.g., such as a raised or elevated source/drain) and also improve device performance relative to a transistor structure in which contact metallization is in direct contact with channel metal oxide. For embodiments where a metal oxide is deposited at block 110, the contact buffer metal oxide deposited at block 120 may have a different composition that results in a superior contact (e.g., lower resistance) and/or forms a more thermally stable metallurgical junction with the contact metallization. In any case, a metallurgical junction between channel semiconductor material and contact buffer material may be more or less apparent.

For embodiments where the channel material deposited at block 110 is a first of one of the metal oxide compositions described above, the contact buffer material may be a second of one of the metal oxide compositions described above. In some specific examples, the contact buffer material deposited at block 120 comprises oxygen and at least one of In, Sn, Ir, Ti, Sb, Zn, or Al. The inventors have found indium oxide embodiments to have advantageously low resistances. Indium oxide materials may also form relatively stable interfaces with a variety of metallization structures. Iridium oxide materials may also form relatively stable, low resistance interfaces with a variety of metallization structures. Titanium oxide materials similarly appear to form suitable interfaces with a variety of metallization structures. As such, it may be particularly advantageous for the buffer metal oxide deposited at block 120 to include one or more of In, Ir, and Ti. A buffer material comprising a significant amount of Zn may also be particularly advantageous at least for stability. Although not bound by theory, improved thermal stability of a metal oxide comprising Zn may be attributable to Zn having a completely filled d-orbital.

In some embodiments, the contact buffer material deposited at block 120 may include two or more metals. For example, the metal oxide formed may include two or more of In, Sn, Ir, Ti, Sb, Zn, or Al. An indium oxide embodiment may further include Sn, for example, as a contact buffer of $InSnO_x$ (ITO) has also been found to offer low-resistance and good thermal stability with some contact metallizations. Another multi-metal composition that may be advantageous as a buffer metal oxide is $AlZnO_x$ (AZO).

In some further embodiments, the contact buffer material deposited at block 120 includes a greater atomic % of at least one of In, Sn, Ir, Ti, Sb, Zn, or Al than the channel material deposited at block 110. Hence, where the constituents of the contact buffer material deposited at block 120 are the same as those of the channel material deposited at block 120, the concentrations of the constituents may advantageously differ such that the contact buffer metal oxide has more of at least one of In, Sn, Ir, Ti, Sb, Zn, or Al than the channel material. For example, in some embodiments where both channel material and contact buffer material comprise In and Zn, the buffer semiconductor oxide has at least 10% more In than the channel semiconductor.

Methods 101 continue at block 130 where contact metallization is formed over the buffer metal oxide. Any contact metallization may be deposited by any means at block 130. The contact metallization may be deposited by PVD, CVD, or ALD, for example. The contact metallization may also be deposited by electrolytic or electroless plating. In some exemplary embodiments, at least one of Ti, Cu, Ta, Co, Ni, Pt, Pd, or Al is deposited directly on the contact buffer semiconductor oxide. Any of these metals, an alloy including two or more of these metals, or a compound further including nitrogen (e.g., TiN or TaN) may form a thermally stable low resistance contact to contact buffer having one of the compositions described above.

Methods 101 continue at block 140 where a gate stack is formed and the device terminals then interconnected into circuitry. At block 140, a gate stack including a gate dielectric and a gate electrode is formed over a channel portion of the semiconductor material that was earlier deposited at block 110. Any gate dielectric may be formed at block 140, and any gate electrode material may be deposited over the gate dielectric so as to be capacitively coupled to at least a portion of the channel semiconductor material. At block 140 a gate stack may be formed over, under, or adjacent to a sidewall of the channel semiconductor material. Methods 101 then end with IC die interconnection, for example, to couple terminals of multiple transistors into circuitry. In some such embodiments, at block 140 BEOL TFT circuitry is electrically interconnected to FEOL Group IV (e.g., Si or SiGe) FET circuitry through one or more metallization levels.

Figure 2:
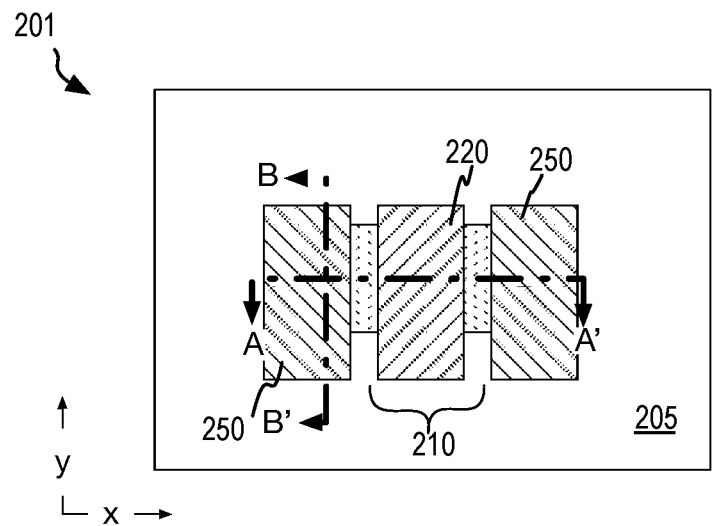
FIG. 2 is a plan view of a transistor structure including a metal oxide contact buffer, in accordance with some embodiments.

FIG. 2 is a plan view of a transistor structure 201 including a channel material and a contact buffer material, in accordance with some embodiments. In FIG. 2, heavy dot-dashed lines denote planes A-A' and B-B' along which cross-sectional views are further provided for various embodiments further described below. Transistor structure 201 may be arrayed over an area of a device layer within IC die, for example. Transistor structure 201 is a FET with a source terminal, a drain terminal, and a gate terminal, in accordance with some illustrative embodiments. These terminals are at least in part electrically coupled through one or more channel material, for example having one or more of the compositions described above in the context of methods 101. Transistor structure 201 may be a planar FET, or a non-planar FET. Non-planar examples include a FinFET, Tri-Gate, and omega-gate. For both planar and non-planar embodiments, the channel region may be laterally oriented (e.g., transistor structure 201) or vertically oriented, for example as described further below.

In FIG. 2, transistor structure 201 is over a substrate with a channel material 210 extending over an area of a substrate 205. Channel material 210 is separated from at least one of a source and/or drain metallization 250 by a contact buffer (not visible in FIG. 2). Channel material 210 is semiconductor material, for example having any of the compositions described above, such as a metal oxide semiconductor, etc. A gate electrode 220 overlaps, underlaps, or otherwise intersects channel material 210. Gate electrode 220 may include an elemental metal layer, a metal alloy layer, or laminate structure of either or both. In some embodiments the gate electrode is a metal nitride, such as TiN. The gate electrode may also comprise Al (e.g., TiAlN). Other alloy constituents may also be employed in gate electrode 220, such as, but not limited to C, Ta, W, Pt, and Sn.

With a lateral channel layout, source and drain contact metallization 250 is on opposite sides of gate electrode 220, with a dielectric material between sidewalls of gate electrode 220 and contact metallization 250. Contact metallization 250 may include any of the metal(s) described above in the context of block 130 in methods 101 (FIG. 1), for example. The plan view of transistor structure 201 is applicable to a number of transistor architectures, some of which are further described in the context of FIG. 3-9. For the sake of clarity, reference numbers are repeated for features that may share the same attributes (e.g., composition).

Figure 3A:
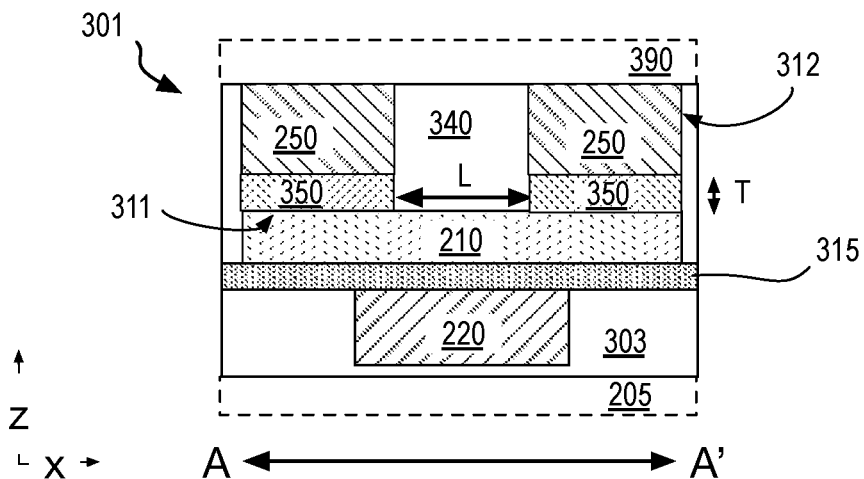
FIGS. 3A, 3B, and 3C are cross sectional views of transistor structures including a metal oxide contact buffer along the A-A' line introduced in FIG. 2, in accordance with some embodiments.
Figure 3B:
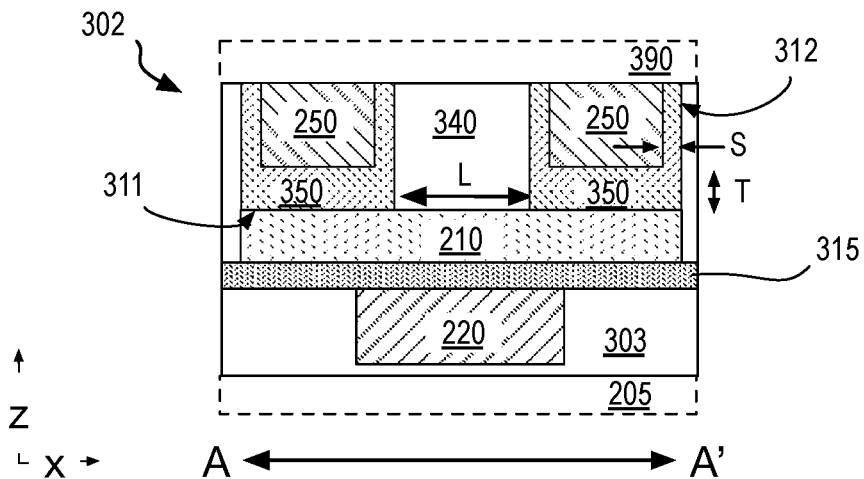
Figure 3C:
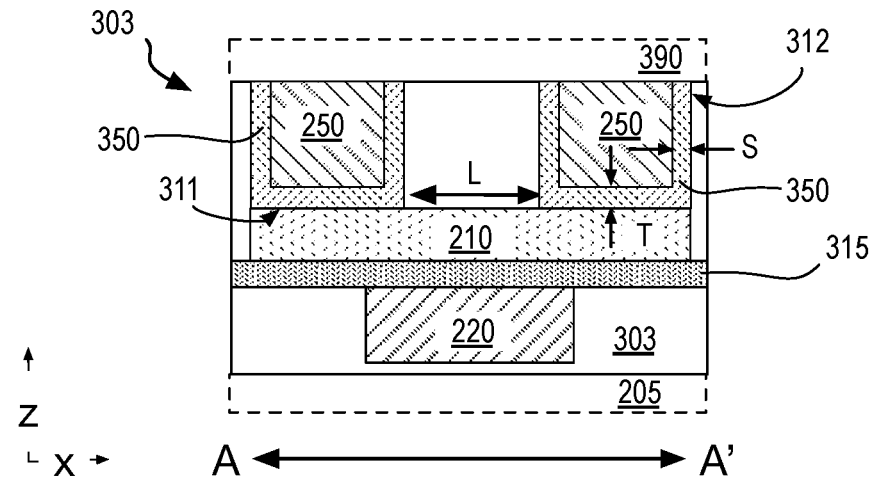

In FIG. 3A, transistor structure 301 comprises gate electrode 220 on a bottom side of channel material 210, and source and drain contact metallization 250 on a top side of channel material 210. Gate electrode 220 is embedded within a dielectric material 303, which may be any suitable material such as, but not limited to, silicon dioxide, silicon nitride, or silicon oxynitride, a low-k material having a relative permittivity below 3.5, for example, or a dielectric metal oxide. Dielectric material 303 is over substrate 205, which is illustrated in dashed line to emphasize that substrate 205 may include any number of FEOL material and/or circuitry levels. Similarly, source and drain contact metallization 250 is embedded within a dielectric material 340, which may be any suitable material (e.g., silicon dioxide, silicon nitride, or silicon oxynitride, or a low-k material). Any number of BEOL material and/or circuitry levels 390 may be over dielectric material 340.

In the "bottom-gate" architecture illustrated in FIG. 3A, within channel material 210 there is a gate length L that is dependent on the spacing of source/drain contact metallization 250, which may be defined by some minimum lithographic feature resolution (e.g., 10-20 nm pitch). As noted above, contact metallization 250 is separated from channel material 210 by a contact buffer material 350. Contact buffer material 350 comprises a metal oxide, for example have any of the compositions described above (e.g., block 120 (FIG. 1)). As shown in FIG. 3A, contact buffer material 350 separates channel material 210 from contact metallization 250 of both the transistor source and drain terminals. Contact buffer material 350 has a material thickness T that vertically spaces (e.g., in the z-dimension) contact metallization 250 from channel material 210. Buffer region thickness T may be as little as 1-2 nm, for example, but may be 10 nm, or more. Channel length L is independent of gate length (e.g., x-dimension) in the illustrated bottom gate architecture, so gate electrode 220 may extend under source/drain contact metallization 250 by an arbitrary amount. As shown, channel length L is dependent on lateral distance between sidewalls of two portions of contact buffer material 350 with at least dielectric material 340 therebetween.

FIG. 3A further illustrates a gate dielectric 315 between channel material 210 and gate electrode 220. Gate dielectric 315 may be any material(s) compatible with channel material 210 and gate electrode 220. Together, gate electrode 220 and gate dielectric 315 are referred to herein as a gate stack. While any gate stack materials known to be suitable for a particular channel material may be utilized, in some exemplary embodiments the gate stack includes a high-k dielectric material (with a bulk relative permittivity greater than 9), and a metal gate electrode having a work function suitable for the channel semiconductor composition. Exemplary high-k materials include dielectric metal oxides, such as, but not In some examples, the gate dielectric comprises oxygen and at least one of Hf (e.g., $HfO_2$), Al(e.g., $Al_2O_3$), Zr(e.g., $ZrO_2$), Y(e.g., $Y_2O_3$), Ta (e.g., $Ta_2O_5$), or Ti (e.g., $TiO_2$). Silicates, such as, but not limited to $HfSiO_x$, or $TaSiO_x$ may also be suitable. In other embodiments gate dielectric 315 is $SiO_2$, or SiON.

Transistor structure 301 may be fabricated according to a variety of techniques. Methods 101 may be employed for example, where channel material 210 is deposited over dielectric material 303. Dielectric material 340 may then be deposited over channel material 210, contact openings or vias may be etched through dielectric material 340 to expose portions of the channel material 210. Contact buffer material 350 may be deposited within the via before contact metallization 250 is deposited within the via. As such, contact buffer material 350 may have substantially the same lateral dimensions (e.g., x-dimension) as contact metallization 250 with a bottom of contact metallization 250 separated from channel material 210 by buffer thickness T.

Depending on the deposition technique(s) employed, contact buffer material 350 may be more or less conformal within the via. More conformal deposition techniques may form a thicker liner on sidewalls of the via. In transistor structure 301 shown in FIG. 3A, for example, contact buffer material 350 is highly non-conformal (e.g., having been deposited by PVD), with virtually no contact buffer material between sidewalls of dielectric 340 and contact metallization 250. In the transistor structure 302 shown in FIG. 3B, contact buffer material 350 is more conformal (e.g. having been deposited by CVD) with a non-zero sidewall liner thickness S that is significantly less than (e.g., 25-50%) buffer thickness T. In the transistor structure 303 shown in FIG. 3C, contact buffer material 350 is substantially conformal (e.g., having been deposited by ALD), with sidewall liner thickness S being substantially equal to buffer thickness T at the bottom of the via and interfacing with channel material 210. A similar variation in contact buffer conformality is possible for any of the transistor structures further described below.

Figure 4:
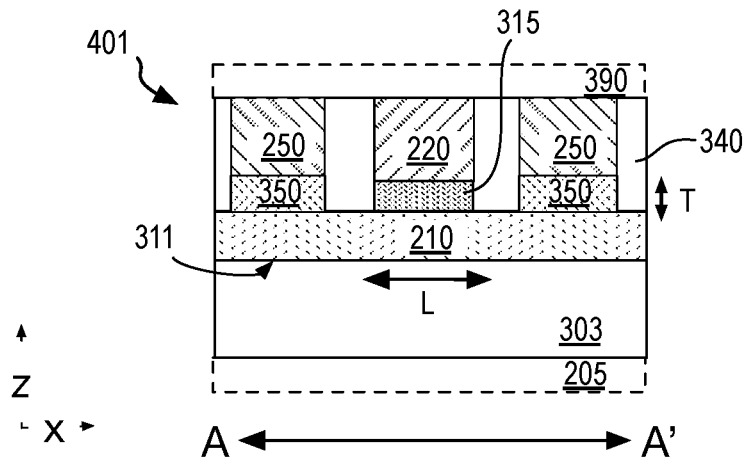
FIGS. 4, 5, 6, 7, 8, and 9 are cross sectional views of transistor structures including an metal oxide contact buffer along the A-A' line introduced in FIG. 2, in accordance with some embodiments.
Figure 5:
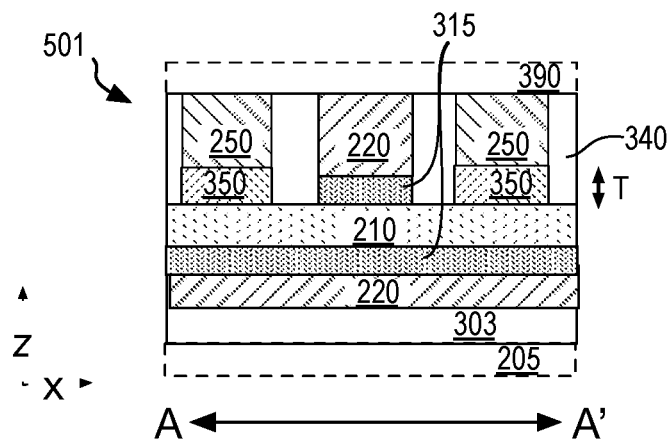

FIG. 4 illustrates an exemplary transistor structure 401 that includes a top-side gate electrode 220 along with a top-side contact buffer material 350 and top-side source and drain contact metallization 250. In this architecture, gate dielectric 315 is again between gate electrode 220 and channel material 210. However, transistor channel length L is dependent on physical dimensions of gate electrode 220 and also the lateral space between electrode 220 and contact metallization 250 where there is dielectric material 340. FIG. 5 illustrates a cross-sectional view of a double gate transistor structure 501, in accordance with some further embodiments that add a bottom gate 220 to the top-side three terminal transistor structure 401 (FIG. 4).

Figure 6:
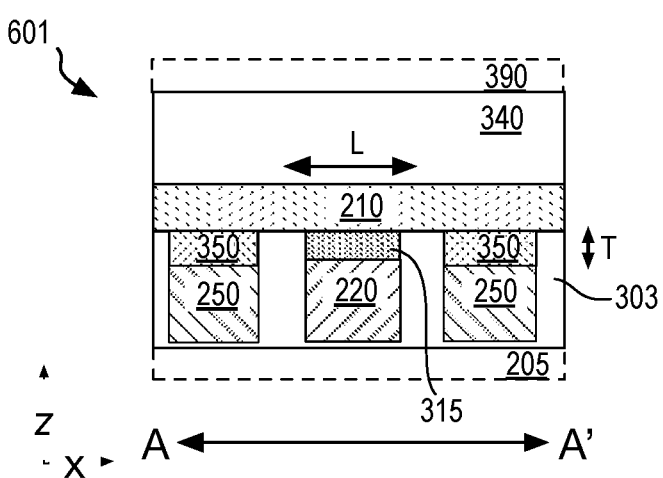

FIG. 6 illustrates a transistor structure 601 that includes a bottom-side gate electrode 220 along with a bottom-side contact buffer material 350, and bottom-side source/drain contact metallization 250. In this FET architecture, contact buffer material 350 is again vertically separating channel material 210 from contact metallization 250. Similar to transistor structure 401, transistor channel length L is dependent on physical dimensions of gate electrode 220, and also a lateral spacing between electrode 220 and contact metallization 250 occupied by one dielectric material 303. Transistor structure 601 may be fabricated, for example, by first forming vias into dielectric material 303, depositing metallization 250 into the vias, and then recessing a portion of metallization 250 within the vias. Contact buffer material 350 may then be deposited over contact metallization 250. Channel material 210 may then be deposited over contact buffer material 350 and over the intervening gate stack.

Figure 7:
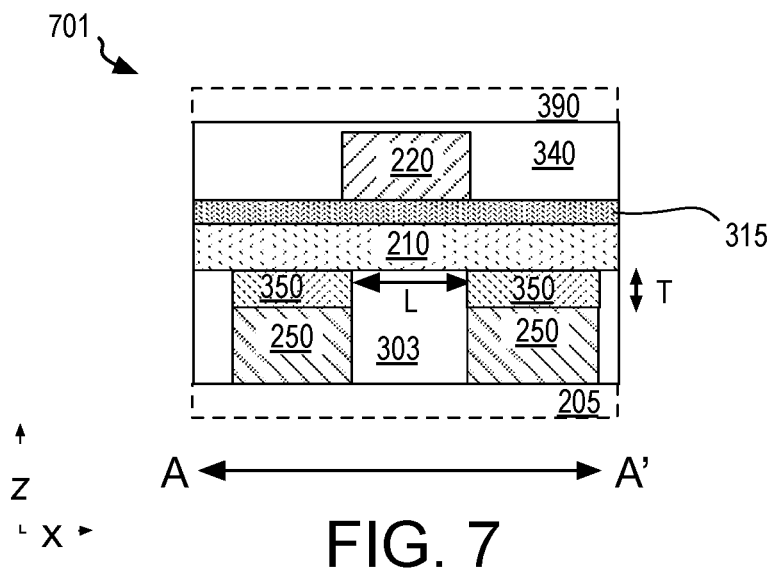

In FIG. 7, transistor structure 701 comprises gate electrode 220 on a top-side of channel material 210 while contact buffer material 350 and contact metallization 250 are on a bottom side of channel material 210. Device terminals of transistor structure 701 are therefore inverted from those of transistor structure 301 (FIG. 3). As shown in FIG. 7, gate electrode 220 is embedded within a dielectric material 340 while source/drain metallization 250 and contact buffer material 350 are embedded in dielectric material 303. In the "top-gate" architecture illustrated in FIG. 7, transistor channel length L is again dependent on the spacing between source/drain contact metallization 250 (and contact buffer material 350), which may be defined by some minimum lithographic feature resolution (e.g., 10-20 nm pitch). Channel length L is independent of gate length (e.g., x-dimension) in this top gate architecture. Hence, gate electrode 220 may extend over contact metallization 250 (and contact buffer material 350) by an arbitrary amount and may even be present over the entire area of channel material 210.

Figure 8:
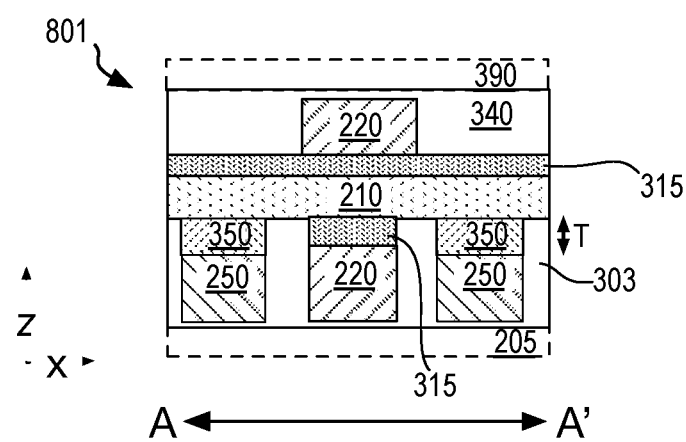

FIG. 8 depicts a double gate transistor structure 801 that includes terminals inverted from those of transistor structure 501 (FIG. 5). Transistor structure 801 therefore again includes gate dielectric 315 under, and over, channel material 210. Fabrication of transistor structure 801 may therefore proceed with the fabrication of contact metallization 250, contact buffer material 350, and a first gate stack according to any suitable techniques. The channel material 210 may then be deposited, and a second gate dielectric 315 and gate electrode 220 subsequently formed over channel material 210.

Figure 9:
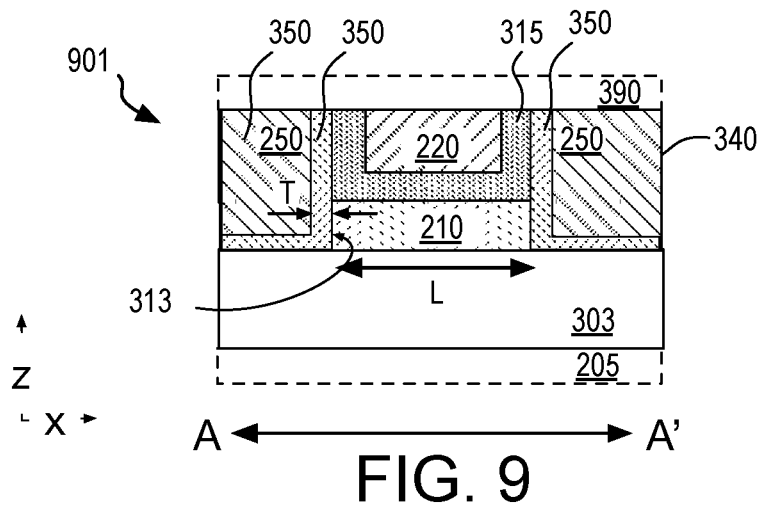

FIG. 9 illustrates a transistor structure 901 having some structural similarities with the top-side terminal transistor structure 401 (FIG. 4). As shown in FIG. 9, however, contact buffer material 350 intersects and/or is adjacent to a sidewall of channel material 210. For such embodiments, channel material sidewall 313 is laterally separated from contact metallization 250 by contact buffer thickness T that is substantially normal to channel semiconductor oxide sidewall 313. Any of the transistor architectures described above that include top-side source/drain metallization may similarly have source and/or drain contact metallization that couples through a contact buffer that is adjacent to a sidewall of a channel material. As further shown, transistor structure 901 has a channel length L that is dependent on both a lateral dimension of gate electrode 220 and thickness of gate dielectric 315, which separates gate electrode 220 from contact buffer material 350. Gate dielectric 315 may be the only dielectric material spacing gate electrode 220 from contact buffer material 350.

Transistor structure 910 may be fabricated, for example, by first forming the gate stack (or a sacrificial mandrel that is eventually replaced with the gate stack) over a portion of channel material 210. A portion of channel material 210 that is not protected by the gate stack (or mandrel) may then be etched, for example with any suitable self-aligned anisotropic etch process. Contact buffer material 350 may then be deposited onto a sidewall of the gate stack (e.g., gate dielectric 315) or mandrel, and onto a sidewall of channel material 210. Contact metallization 250 may then be deposited and planarized with a top surface of the gate stack (e.g., gate electrode 220) or mandrel. For embodiments where a gate mandrel was employed, the mandrel may be selectively removed and replaced by depositing gate dielectric 315 onto channel material 210 with a conformal deposition process (e.g., ALD) to form the u-shape cross-sectional profile illustrated in FIG. 9. Gate electrode 220 may then be deposited and the gate stack planarized with contact metallization 250.

In alternative embodiments, the gate mandrel may be replaced with not only the gate stack, but also with the channel material 210. For such embodiments, a gate mandrel may be patterned over dielectric material 303, contact buffer material 350 and contact metallization 250 then deposited over the gate mandrel and over dielectric material 303. Contact buffer material 350 and contact metallization 250 may then be planarized with a top surface of the gate mandrel, which is then removed to expose the underlying dielectric material 303.

Channel material 210 may then be deposited in either a non-conformal manner to arrive substantially at the structure illustrated in FIG. 9, or a conformal manner to form a channel structure having a u-shaped cross-sectional profile. Gate dielectric material 315 and gate electrode 220 may then be deposited and planarized with a top surface of contact metallization 250.

Figure 10:
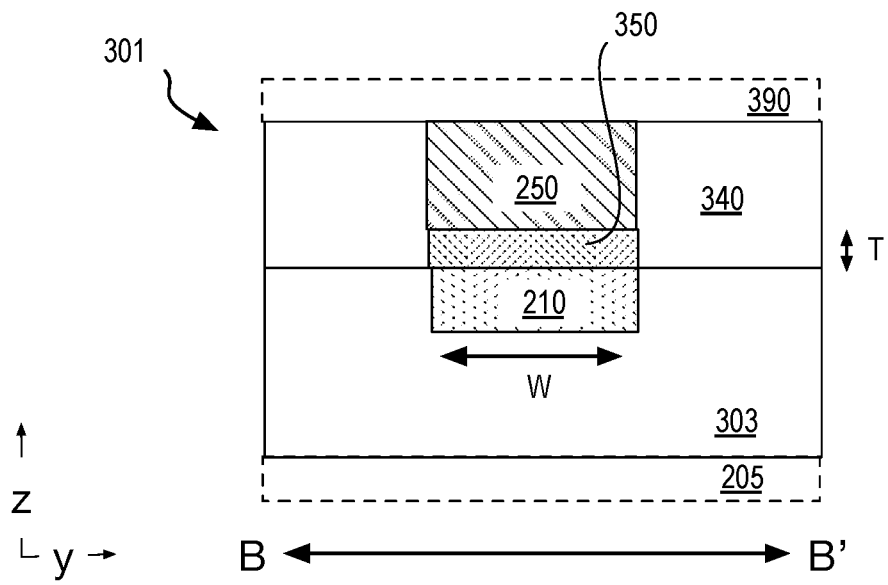
FIGS. 10 and 11 are cross sectional views of transistor structures including a metal oxide contact buffer along the B-B' line introduced in FIG. 2, in accordance with some embodiments.

FIG. 10 is a cross-sectional view of transistor structure 301 (FIG. 3A) along the B-B' line introduced in FIG. 2 that extends through contact metallization 250. The features shown in FIG. 10 are applicable to any of the transistor structures described above that have top side contact metallization (e.g., 401, 501, 901). As shown in FIG. 10, channel material 210 has a channel width W. Channel width W may be, for example, a minimum lithographically defined feature geometry (e.g., 10-30 nm). As further denoted in FIG. 10, contact buffer 250 is only in contact with a top surface of channel material 210. However, any of the transistor structures described above may instead have a wrap-around source/drain contact metallization architecture where contact buffer 250 is adjacent to a sidewall of channel material 210 in addition to being over the top surface of channel material 210. For example, in the context of FIG. 10 contact buffer 250 and contact metallization 350 may both extend beyond the edges of channel material 210 to further interface with a sidewall of channel material 210. Such sidewall coupling may be supplemental to planar surface coupling. Alternatively, a contact buffer to a sidewall of a channel semiconductor oxide may be relied upon exclusively.

Figure 11:
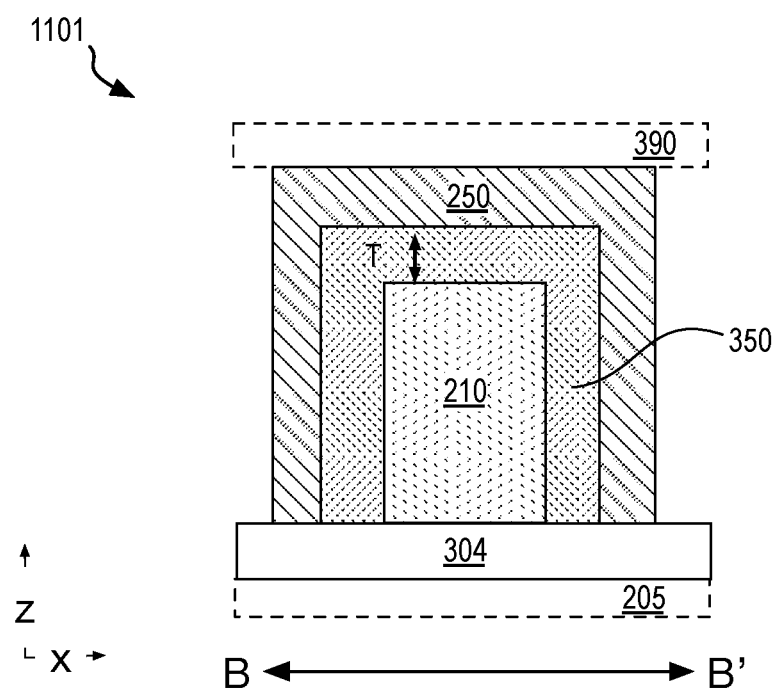

FIG. 11 is a cross-sectional illustration through a transistor structure 1101, substantially along the B-B' line illustrated in FIG. 2. In FIG. 11, transistor structure 1101 includes non-planar channel material 210. Fabrication of transistor structure 1101 may entail the deposition of a channel material, followed by a patterning of the material to generate non-planar features having a sidewall. Contact buffer material 350 may then be deposited over the non-planar feature to be adjacent to a sidewall of the channel material 210, substantially as shown for transistor structure 1101. Source/drain contact metallization 250 may then be deposited over contact buffer material 350 so that contact metallization 250 is adjacent to contact buffer material 350.

Contact buffers may also be integrated into transistor structures that have non-planar channel architectures. For example, a channel semiconductor oxide may be over an underlying topographic feature. For such embodiments, a mandrel may be formed over a substrate. The mandrel may be sacrificial, or a permanent feature of a transistor structure. In some embodiments, the mandrel comprises a dielectric material that is patterned into a feature, such as, but not limited to, a pillar, a line, or any other polygon known to be suitable as a backbone for a double-patterning (e.g., pitch splitting) process. For other embodiments, for example where the mandrel is to further functional as a terminal of the transistor structure, the mandrel may comprise any of a gate electrode (and gate dielectric), a source terminal contact metallization, or a drain terminal contact metallization.

The channel material may then be deposited over at least a sidewall of the mandrel, and in some embodiments the precursor material is blanket deposited over the top surface and sidewall of the mandrel structure, as well as over a field portion of the substrate between adjacent mandrel structures. The channel material may then be patterned into separate bodies. The mandrel structure may then be selectively removed in sacrificial mandrel embodiments, and potentially replaced, for example, with a gate electrode or source/drain structure.

Figure 12A:
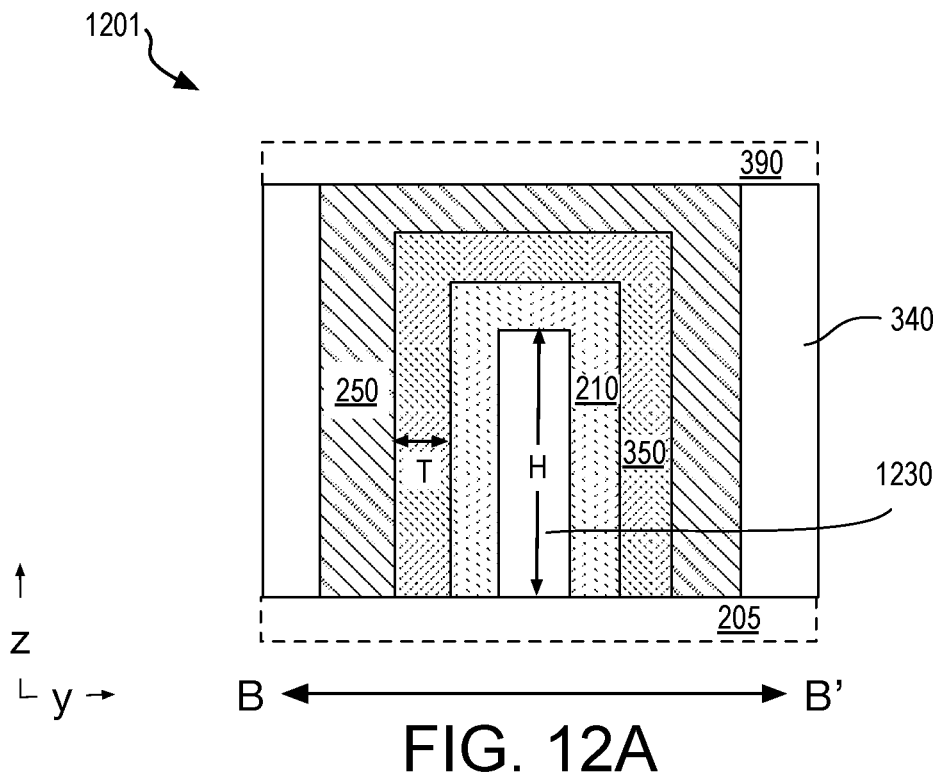
FIGS. 12A, 12B, 12C, and 12D are cross sectional views of transistor structures including a metal oxide contact buffer along the B-B' line introduced in FIG. 2, in accordance with some embodiments.

FIG. 12A illustrates an exemplary transistor structure 1201 along the B-B' line introduced in FIG. 2. As shown in FIG. 12A, contact buffer material 350 and contact metallization 250 have been deposited over a non-planar channel material 210, which was deposited over mandrel structure 1230. Channel material 210 therefore has a channel width that is approximately equal to twice a height H (e.g., z-dimension) of mandrel structure 1230 summed with a width (e.g., y-dimension) of mandrel structure 1230. Height H may vary, but may be 20-50 nm, for example. For transistor structure 1201, contact buffer material 350 is adjacent to only one sidewall of channel material 210, and another sidewall of channel material 210 is in contact with mandrel structure 1230.

Figure 12B:
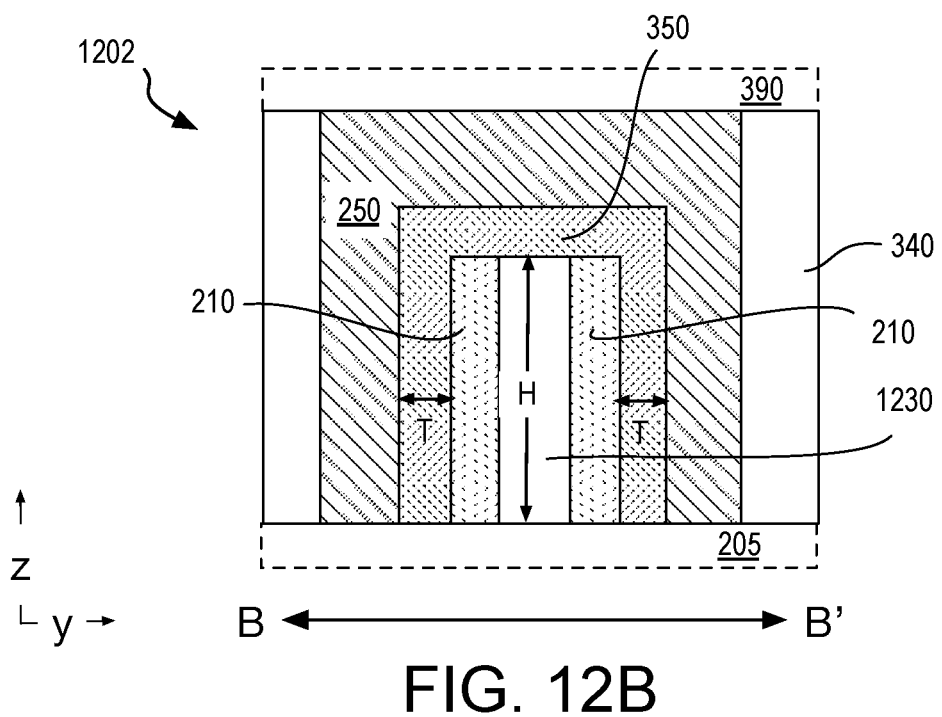

FIG. 12B illustrates another exemplary transistor structure 1202 that also includes a single contact metallization 250 and contact buffer material 350 adjacent to a sidewall of second channel material 210. Transistor structure 1202 is similar to transistor structure 1201, however in transistor structure 1202 channel material 210 has a top surface that is substantially planar with a top surface of mandrel structure 1230 (e.g., has the same height H). Transistor structure 1202 may be formed for example when an unpatterned anisotropic etch of a channel material exposes a top surface of mandrel structure 1230 with channel material 210 retained as only a self-aligned spacer along the sidewall of mandrel structure 1230. Channel material 210 may be contiguous, for example in cylindrical structure.

Alternatively, in embodiments where transistor structure 1202 is patterned in the second planar dimension (e.g., x-dimension), channel material 210 may be bifurcated into two separate transistor channels that may be contacted through a single source/drain contact structure that includes one contact buffer material 350. Channel material 210 may further share a single gate stack (not depicted), or each may be coupled to different gate terminals.

Figure 12C:
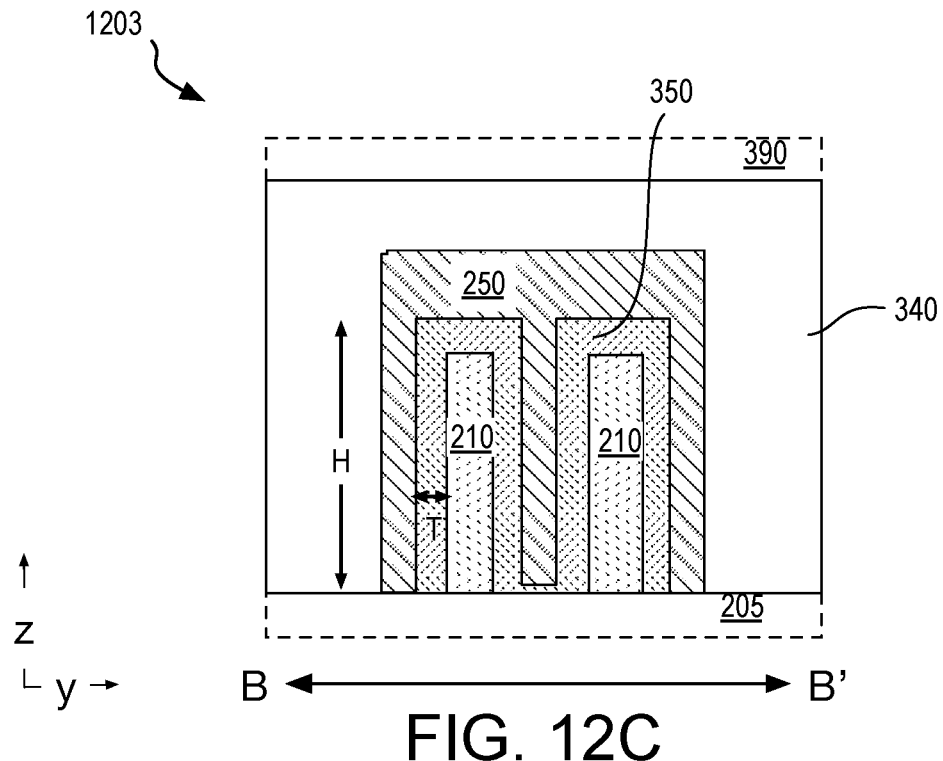

As noted above, a mandrel structure may be sacrificial. FIG. 12C further illustrates an alternative transistor structure 1203 where the mandrel structure was removed (e.g., from transistor structure 1202) prior to formation of contact buffer material 350. In such embodiments, the mandrel structure is replaced with contact buffer material 350 and contact metallization 250. Removal of the mandrel structure may, for example, have the advantage of reducing source/drain contact resistance by increasing area contact between contact buffer material 350 and channel material 210A, 210B.

Figure 12D:
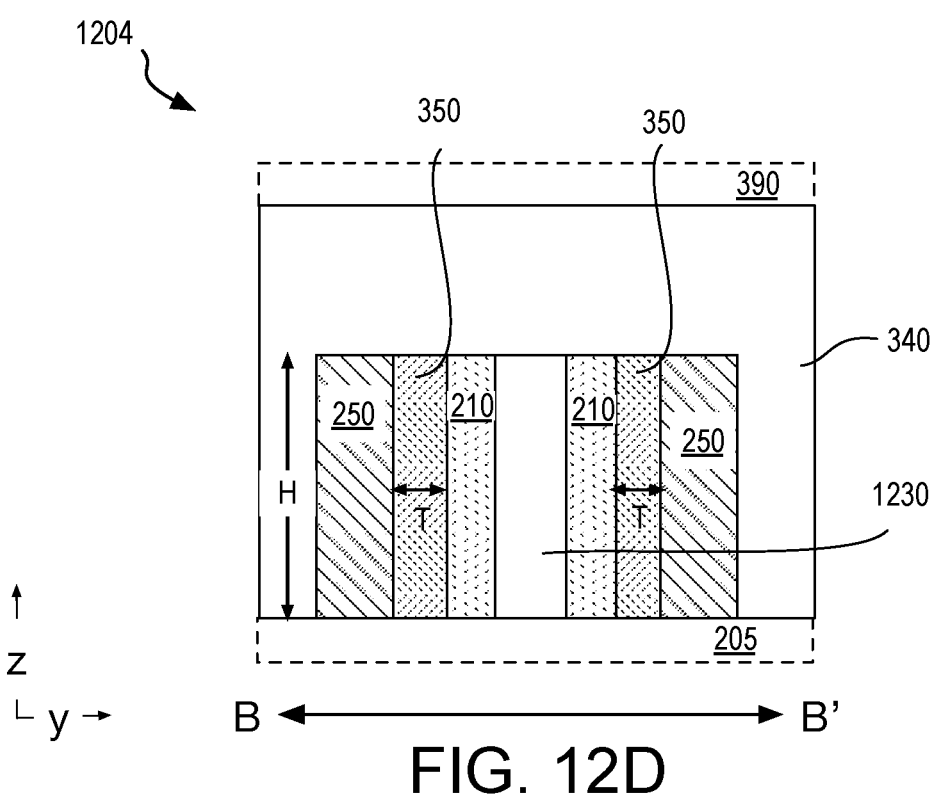

While the non-planar transistor structures described above comprise a single source drain contact coupled to multiple semiconductor bodies through a single contact buffer, alternative fabrication techniques may planarize a source drain contact structure down to the height of an underlying channel semiconductor oxide. Such a planarization may separate a single contact buffer structure into multiple contact buffers. FIG. 12D illustrates an exemplary transistor structure 1204, which may be fabricated by planarizing the contact metallization and contact buffer material of transistor structure 1202 (FIG. 12B), for example. As shown in FIG. 12D, an inner sidewall of channel material 210 is adjacent to a sidewall of mandrel structure 1230 with contact buffer material 350 adjacent (e.g., y-dimension) to an outer sidewall of channel material 210. Contact metallization 250 is further adjacent to contact buffer material 350.

A top surface of contact buffer material 350 (or mandrel structure 1230) is substantially planar with a top surface of contact metallization 250.

Figure 13A:
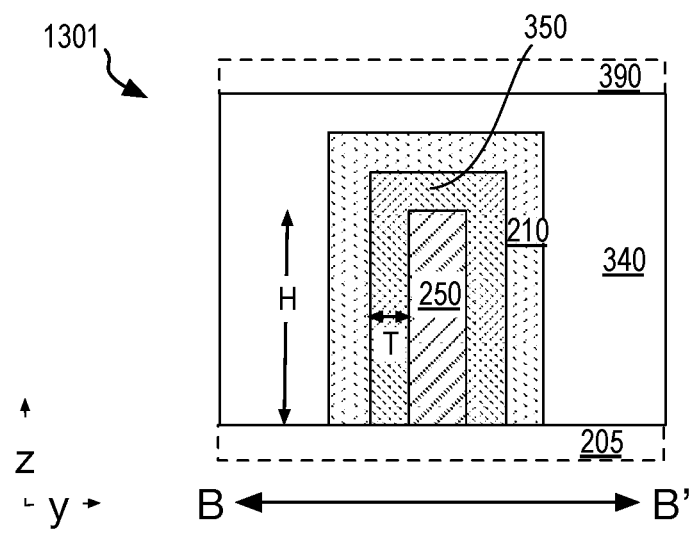
FIGS. 13A and 13B are cross sectional views of transistor structures including a metal oxide contact buffer along the B-B' line introduced in FIG. 2, in accordance with some embodiments.

As noted above, a mandrel structure need not be a dielectric, but may instead be an alternative material, such as a metal. For some non-sacrificial mandrel embodiments, the mandrel structure may include contact metallization with the mandrel then functionally operable as a gate electrode or source or drain contact metallization of the transistor structure. In such embodiments, non-planarity of the metallization may impart a non-planarity in both a contact buffer material and a channel material. FIG. 13A illustrates a transistor structure 1301 that comprises a non-planar contact metallization 250 that was patterned into a feature, such as a pillar or fin. Contact buffer material 350 is adjacent to a sidewall of contact metallization 250, and channel material 210 is adjacent to a sidewall of contact buffer material 350. As such, transistor structure 1301 is similar to transistor structure 1201 (FIG. 12A), with the material layer order reversed.

Figure 13B:
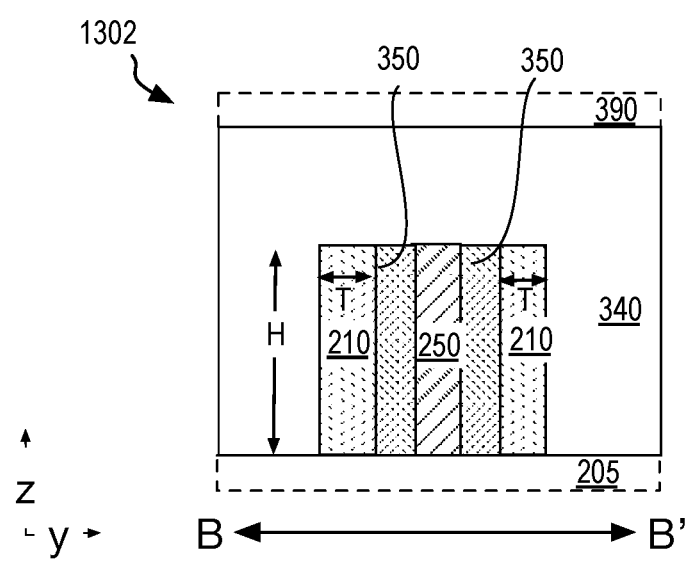

Any of the alternative architectures described in the context of FIG. 12A-12C are also applicable to transistor structure 1301. For example, channel material 210 may be planarized to have a same height H as contact metallization 250. As another example, FIG. 13B illustrates a transistor structure 1302 in which channel material 210 has a top surface that is planar with contact metallization 250. For some embodiments, a patterning in the x-dimension bifurcates the symmetrical sides of the structures. In other embodiments, channel material 210, contact buffer material 350 and contact metallization 250 are all contiguous cylindrical or annular structures.

While the transistor structures including a planar or non-planar channel described above have a horizontal channel orientation (e.g., in one x-y plane), transistor structures in accordance with embodiments herein may also include a vertically-oriented channel. In vertically oriented transistor structures, a first source or drain metallization is in a different x-y plane than a second source or drain metallization. In this class of transistor structures, the channel material vertically separates a source contact buffer material from a drain contact buffer material.

Figure 14A:
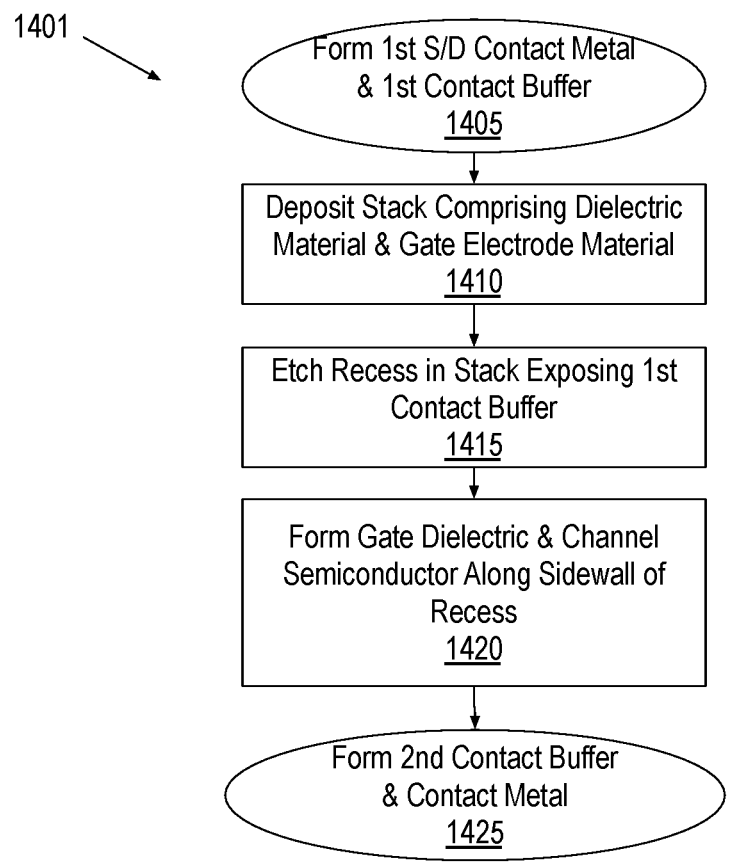
FIG. 14A is a flow diagram illustrating methods of fabricating vertical transistor structures, in accordance with some embodiments.

FIG. 14A illustrates exemplary methods 1401, which begin at block 1405 where a first source/drain metallization and first contact buffer material is deposited over a substrate. At block 1410 a material stack including one or more layers of gate electrode material and one or more layers of any suitable dielectric material is deposited over the first contact buffer material. A recess (e.g., a trench) is then formed through the material layer stack at block 1415, exposing the first contact buffer material at a bottom of the recess. Methods 1401 continue at block 1420 where a gate dielectric is then formed over a sidewall of the gate electrode material layer(s) exposed within the recess. A channel material is then deposited over the gate dielectric along a sidewall of the recess. The structure is then capped with a second contact buffer material and a second source/drain metallization at block 1425.

Figure 14B:
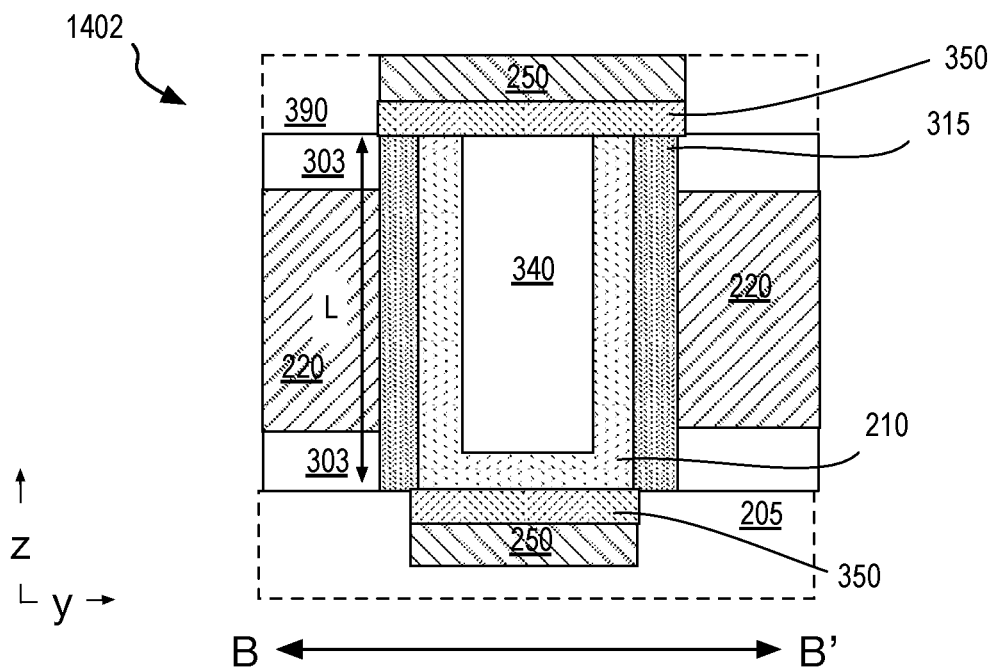
FIG. 14B is a cross sectional view of a vertical transistor structure including a metal oxide contact buffer along the B-B' line introduced in FIG. 2, in accordance with some embodiments.

FIG. 14B illustrates one exemplary vertical transistor structure 1402, which may be fabricated according to methods 1401 (FIG. 14A), for example. As shown in FIG. 14B, transistor structure 1402 includes a top and bottom source and drain metallization 250, each in contact with top and bottom contact buffer material 350, respectively. Channel material 210 spans a vertical (e.g., z) distance separating contact buffer material 350, defining a channel length L of transistor structure 1402. A sidewall of gate electrode 220 is separated from channel material 210 by gate dielectric 315. Although transistor structure 1402 includes only one gate electrode 220, a material stack may include any number of layers of gate electrode material to form a vertical string of gate controlled semiconductor channels that may be employed in a variety of devices, such as an electronic memory device.

A vertical NAND architecture is one example where a stack of gate electrode material layers may each be operable as a control gate electrode in a string comprising many transistor channels. A vertical NAND-type architecture in accordance with some embodiments herein may include a contact buffer material between a channel material and contact metallization substantially as illustrated in FIG. 14B but with multiple layers of gate electrode material 220 that are separated by intervening layers of dielectric material 303. In Fe (ferroelectric) FET (field effect transistor) embodiments, gate dielectric material 315 has a permanent dipole. As a result, the threshold voltage ($V_t$) of each FeFET can vary between multiple states (e.g., $V_{t, high}$ and $V_{t,low}$) as a function of the dipole state of the gate dielectric. A bit value may be assigned to a particular one of the threshold voltage levels, and read out accordingly.

Figure 15:
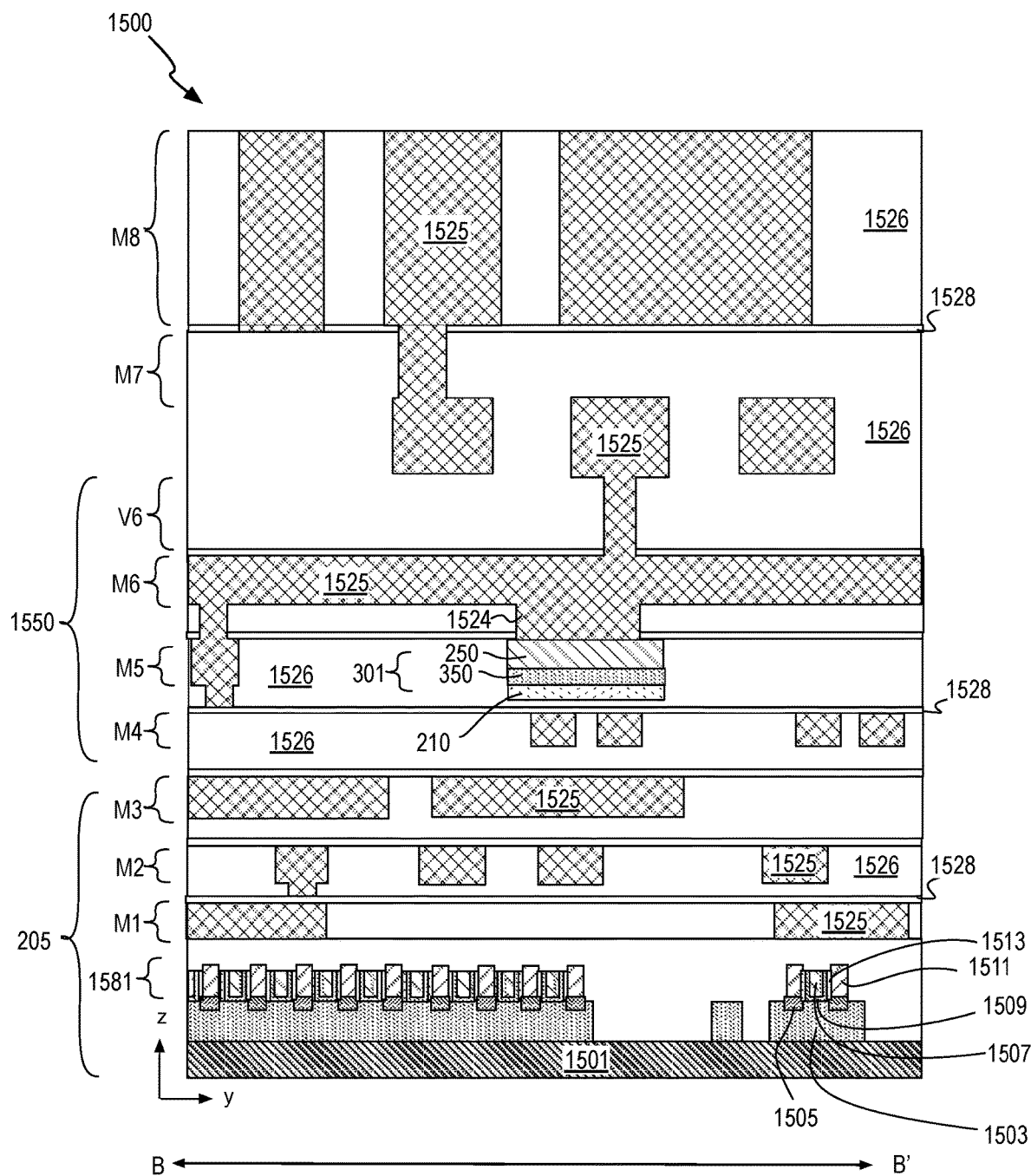
FIG. 15 illustrates a cross-sectional view of a 3DIC structure including oxide semiconductor transistor circuitry over CMOS FET circuitry, in accordance with some embodiments.

Many different TFT architectures have been described to illustrate how a contact buffer material may be integrated into a transistor structure. Any of these transistor architectures may be further integrated into an IC chip. FIG. 15 illustrates a cross-sectional side view of a 3D IC structure 1500, in accordance with some embodiments. Structure 1500 illustrates a portion of a monolithic IC that includes a substrate 205 that comprises FEOL device circuitry fabricated over and/or on a single crystalline substrate 1501. In this example, FEOL device circuitry includes a plurality of MOSFETs 1581 that employ a monocrystalline semiconductor material 1503 for at least a channel region of each transistor. In other embodiments, FEOL device circuitry includes other types of transistors (e.g., bipolar junction transistor, etc.), or other active devices employing one or more semiconductor materials (e.g., diodes, lasers, etc.).

FETs 1581 include a gate terminal 1507 separated from a semiconductor material 1503 by a gate dielectric 1509. The channel region of semiconductor material 1503 separates semiconductor terminals 1505 (source semiconductor and drain semiconductor). Contact metallization 1511 is in contact with semiconductor terminals 1505 and is separated from gate terminal 1509 by an intervening dielectric spacer 1513. Any materials known to be suitable for FETs may be present in FEOL FETs 1581. FETs 1581 may be planar or non-planar devices. In some advantageous embodiments, FETS 1581 are finFETs. FETs 1581 may include one or more semiconductor materials. As one example, semiconductor material 1503 is a surface layer of a substantially monocrystalline substrate 1501. Substrate 1501 may be any material known to be suitable for the fabrication of MOSFET (CMOS) circuitry, such as, but not limited to, group IV materials (e.g., substantially pure silicon, substantially pure germanium, and SiGe alloys that may range from predominantly Si to predominantly Ge).

FEOL device circuitry may further include one or more levels of interconnect metallization 1525 electrically insulated by dielectric materials 1526 and 1528. In the exemplary embodiment illustrated, FEOL device circuitry includes metal-one (M1), metal-two (M2) and metal-three (M3) interconnect metallization levels. Interconnect metallization 1525 may be any metal(s) suitable for FEOL and/or BEOL IC interconnection. Interconnect metallization 1525 may be, for example, an alloy of predominantly Ru or Cu, an alloy of predominantly W, or an alloy of predominantly Al, etc. Dielectric material 1526 may be any dielectric material known to be suitable for electrical isolation of monolithic ICs. In some embodiments, dielectric material 1526 comprises silicon, and at least one of oxygen and nitrogen. Dielectric material 1526 may be SiO, SiN, or SiON, for example. Dielectric material 1526 may also be a low-K dielectric material (e.g., having a dielectric constant below that of $SiO_2$). Dielectric material 1528 has a different composition that dielectric material 1526, and may be of a composition that has a higher dielectric constant than that of dielectric material 1526. In some examples where dielectric material 1526 is predominantly silicon and oxygen (i.e., $SiO_x$), dielectric material 1528 is predominantly silicon and nitrogen (i.e., $SiN_x$).

BEOL device circuitry is located over the FEOL device circuitry, with dielectric material 1526 therebetween. BEOL device circuitry includes a plurality of devices 1550 that employ a channel comprising semiconductor oxide for at least a channel region of each transistor. For the illustrated embodiments, individual ones of devices 1550 include source and/or drain contact metallization 250 separated from channel material 210 by contact buffer material 350. In the exemplary embodiment illustrated, transistor structures 301 are "top-contact" devices with contact metallization 250 and contact buffer material 350 over channel material 210. Although top-contact devices are illustrated, embodiments herein are also applicable bottom-contact transistor architectures, side-contact transistor architectures, or other planar and non-planar transistor architectures, such as any of those described above.

BEOL circuitry may comprise any number of metallization levels over transistor structures 301, such as a metallization level (e.g., M6) immediately above the metallization level (e.g., M5) in which transistor structures 301 reside. As further shown, a via 1524 electrically connects interconnect metallization levels to contact metallization 250. Any number of interconnect metallization levels may couple BEOL circuitry to the underlying FEOL device circuitry. In the example shown in FIG. 15, metallization levels of BEOL circuitry (e.g., M8) may be routed down through any number of metallization levels (e.g., M8-M3) to be in electrical communication with one or more FEOL transistors 1581.

In further embodiments, there may be multiple levels of BEOL device circuitry located over the FEOL device circuitry, each with dielectric material 1526 therebetween. Each level of BEOL device circuitry may include a plurality of devices 1550 that employ a channel material 210 coupled through a contact buffer to at least one of a source or drain contact metallization.

In other embodiments, a 3DIC may include one or more levels of the BEOL device circuitry without any monocrystalline FEOL transistors. For such embodiments, the BEOL devices may be over any substrate (e.g., polymer, glass, etc.). Hence, transistors with thin film semiconductor channels and metal oxide contact buffers may be employed in conjunction with monocrystalline channeled devices, or not.

Figure 16:
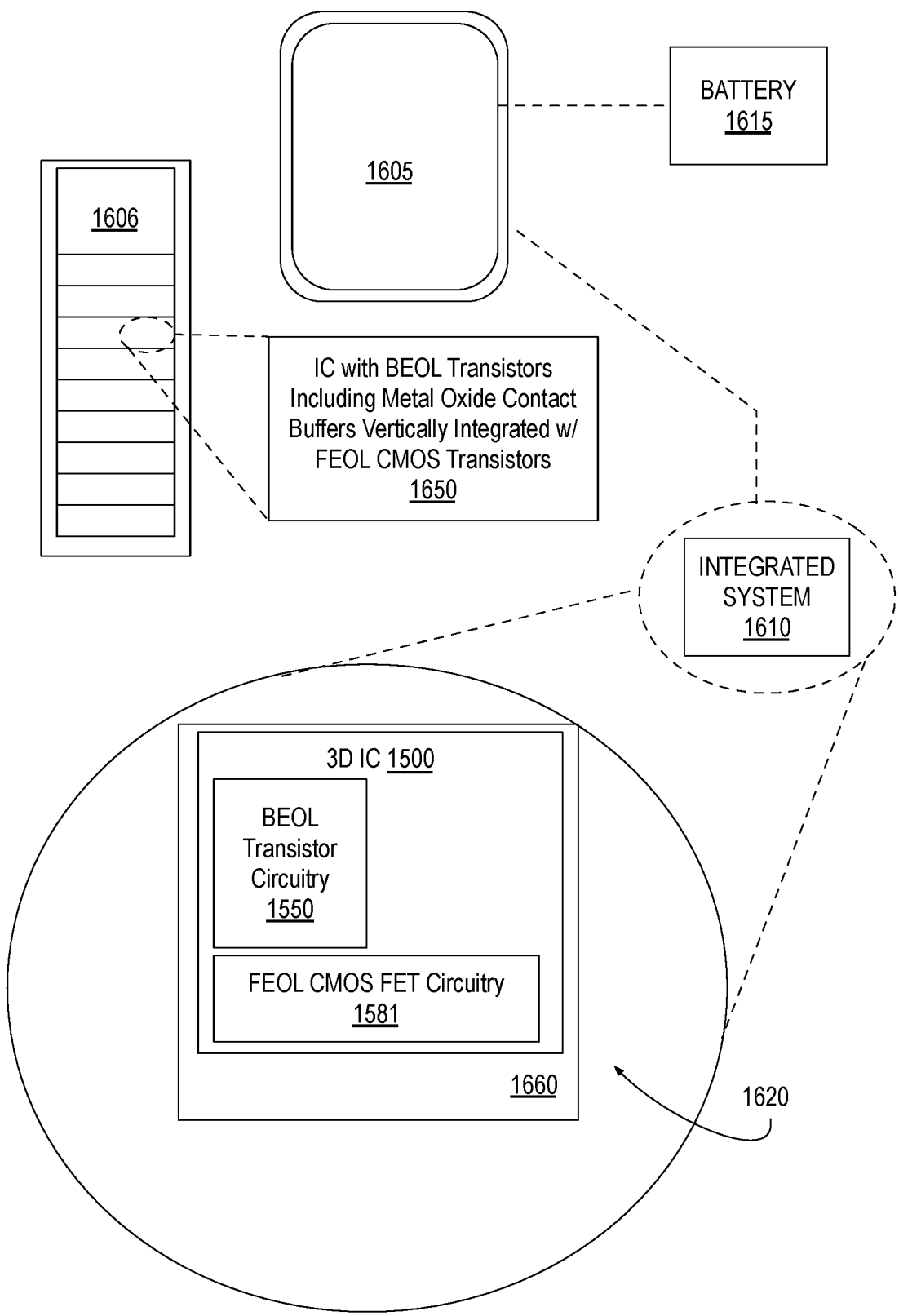
FIG. 16 illustrates a system employing an IC including oxide semiconductor transistor circuitry over CMOS FET circuitry, in accordance with some embodiments.

FIG. 16 illustrates a system in which a mobile computing platform 1605 and/or a data server machine 1606 employs an IC including at least one back-end semiconductor device with a contact buffer. Such a back-end semiconductor device may be over a front-end semiconductor device, in accordance with some embodiments. The server machine 1606 may be any commercial server, for example including any number of high-performance computing platforms disposed within a rack and networked together for electronic data processing, which in the exemplary embodiment includes a packaged monolithic IC 1650. The mobile computing platform 1605 may be any portable device configured for each of electronic data display, electronic data processing, wireless electronic data transmission, or the like. For example, the mobile computing platform 1605 may be any of a tablet, a smart phone, laptop computer, etc., and may include a display screen (e.g., a capacitive, inductive, resistive, or optical touchscreen), a chip-level or package-level integrated system 1610, and a battery 1615.

Whether disposed within the integrated system 1610 illustrated in the expanded view 1620, or as a stand-alone packaged chip within the server machine 1606, monolithic 3D IC 1500 includes a memory chip (e.g., RAM), or a processor chip (e.g., a microprocessor, a multi-core microprocessor, graphics processor, or the like) including at least one transistor with a channel semiconductor material coupled to a source/drain contact through a contact buffer material, for example, as describe elsewhere herein. 3D IC 1500 may further include silicon CMOS front-end circuitry 1581. The 3D IC 1500 may be further coupled to a board, a substrate, or an interposer 1660.

3D IC 1500 may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 1650 or within a single IC coupled to the package substrate of the monolithic IC 1650.

Figure 17:
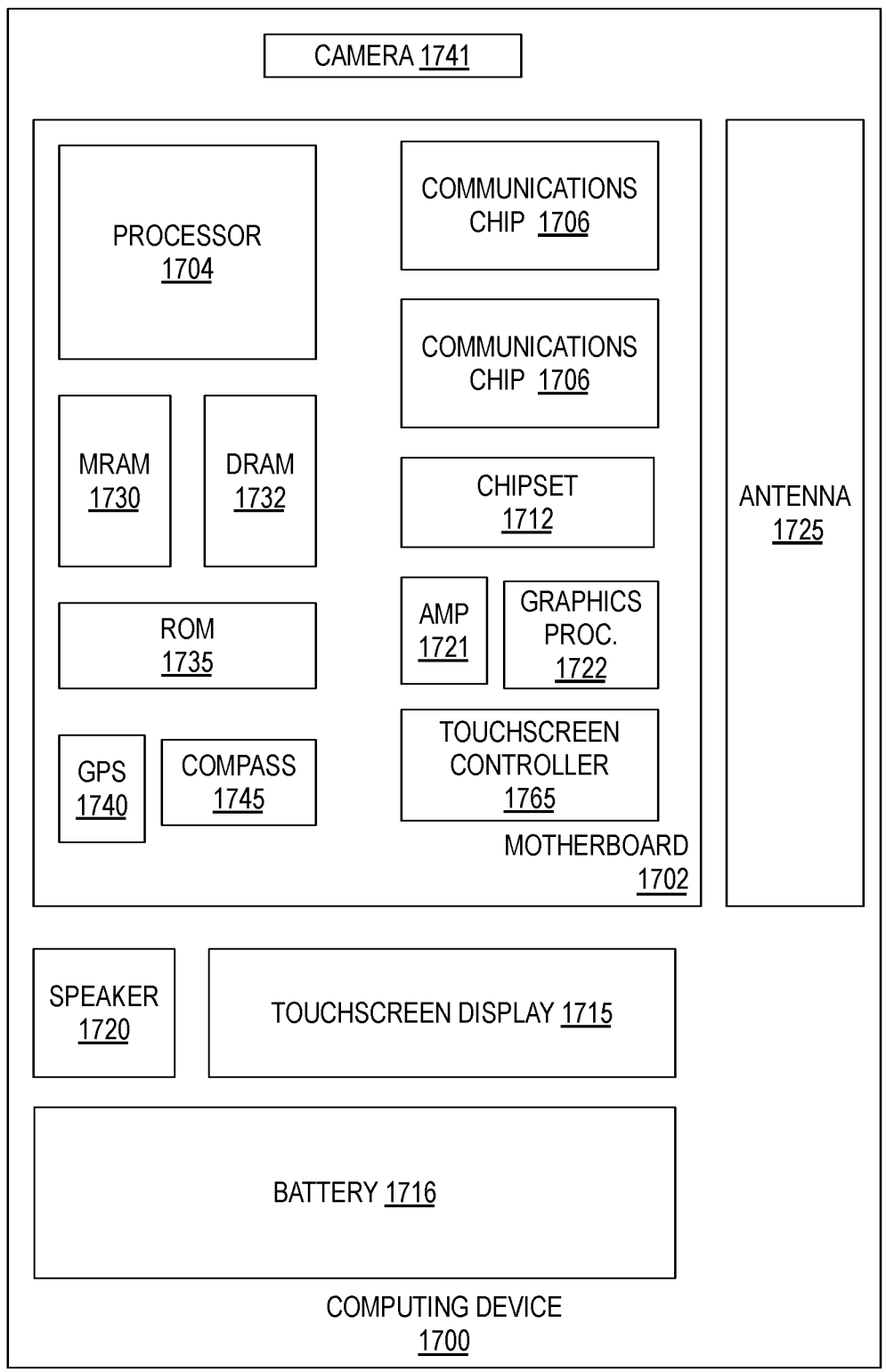
FIG. 17 is a functional block diagram illustrating an electronic computing device, in accordance with an embodiment of the present invention.

FIG. 17 is a functional block diagram of an electronic computing device 1700, in accordance with some embodiments. Device 1700 further includes a motherboard 1702 hosting a number of components, such as, but not limited to, a processor 1704 (e.g., an applications processor). Processor 1704 may be physically and/or electrically coupled to motherboard 1702. In some examples, processor 1704 includes a 3D IC structure, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1706 may also be physically and/or electrically coupled to the motherboard 1702. In further implementations, communication chips 1706 may be part of processor 1704. Depending on its applications, computing device 1700 may include other components that may or may not be physically and electrically coupled to motherboard 1702. These other components include, but are not limited to, volatile memory (e.g., DRAM 1732), non-volatile memory (e.g., ROM 1735), flash memory (e.g., NAND or NOR), magnetic memory (MRAM 1730), a graphics processor 1722, a digital signal processor, a crypto processor, a chipset 1712, an antenna 1725, touchscreen display 1715, touchscreen controller 1765, battery 1716, audio codec, video codec, power amplifier 1721, global positioning system (GPS) device 1740, compass 1745, accelerometer, gyroscope, speaker 1720, camera 1741, and mass storage device (such as hard disk drive, solid-state drive (SSD), compact disk (CD), digital versatile disk (DVD), and so forth, or the like.

Communication chips 1706 may enable wireless communications for the transfer of data to and from the computing device 1700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1706 may implement any of a number of wireless standards or protocols, including, but not limited to, those described elsewhere herein. As discussed, computing device 1700 may include a plurality of communication chips 1706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, a transistor structure comprises a channel material of a first composition. The structure comprises a gate electrode separated from the channel material by at least a gate dielectric. The structure comprises a source contact metallization, and a drain contact metallization. The structure comprises a contact buffer material between the channel material and at least one of the source contact metallization and the drain contact metallization, wherein the contact buffer material is of a second composition, different than the first composition, and comprises oxygen and one or more metals.

In second examples, for any of the first examples the second composition comprises oxygen and at least one of In, Sn, Ir, Ti, Sb, Zn, or Al.

In third examples, for any of the second examples the second composition comprises at least one of In, Sn, Ir, or Ti.

In fourth examples, for any of the first through the third examples the second composition comprises two or more of In, Sn, Ir, Ti, Sb, Zn, or Al.

In fifth examples, for any of the first through the fourth examples the second composition comprises $InSnO_x$.

In sixth examples, for any of the first through fifth examples the first composition comprises oxygen and one or more metals, a chalcogenide and one or more metals, silicon, germanium, a group III-V alloy, or a group III-N alloy.

In seventh examples, for any of the first through sixth examples the first composition comprises oxygen and one or more metals, and the second composition has a greater atomic % of at least one of In, Sn, Ir, Ti, Sb, Zn, or Al than the first composition.

In eighth examples, for any of the first through seventh examples the contact buffer material separates the channel material from both the source contact metallization and the drain contact metallization by distance of at least 2 nm.

In ninth examples, for any of the first through eighth examples the contact metallization comprises at least one of Ti, Cu, Ta, Co, Ni, Pt, Pd, or Al.

In tenth examples, for any of the first through ninth examples the gate electrode is separated from the contact buffer material by one or more dielectric materials.

In eleventh examples, for any of the tenth examples contact buffer material comprises a liner separating the source or drain contact metallization from the dielectric materials.

In twelfth examples, for any of the tenth examples the dielectric materials comprise the gate dielectric.

In thirteenth examples, an integrated circuit (IC) structure comprises a plurality of complementary metal-oxide-semiconductor (CMOS) field effect transistor (FET) structures, wherein individual ones of the CMOS FET structures comprise a Group IV crystalline material. The IC structure comprises a plurality of back-end transistor structures over the CMOS FET structures, with one or more levels of interconnect metallization therebetween. Individual ones of the back-end transistor structures comprise a channel material of a first composition, a gate electrode separated from channel material by at least a gate dielectric, a source contact metallization, and a drain contact metallization. A contact buffer material between is the channel material and at least one of the source contact metallization and the drain contact metallization. The contact buffer material is of a second composition, different that the first composition, and comprises oxygen and one or more metals.

In fourteenth examples, for the IC structure in any of the thirteenth examples the channel material comprises a non-planar body of the first composition, and the contact buffer material is adjacent to a sidewall of the non-planar body.

In fifteenth examples, for the IC structure in any of the thirteenth through fourteenth examples the contact buffer material is adjacent to a sidewall of the source contact metallization or the drain contact metallization.

In sixteenth examples, for the IC structure in any of the thirteenth through fifteenth examples a first contact buffer material is over a first of the source metallization or drain metallization. The channel material is over the first contact buffer material, and a second contact buffer material is over the channel material. A sidewall of the gate electrode is adjacent to the channel material with the gate dielectric therebetween. A second of the source metallization or drain metallization is over the second contact buffer material.

In seventeenth examples, a method of fabricating a transistor structure comprises forming a first material over a substrate, wherein the first material has a first composition. The method comprises forming a gate stack over the first material, the gate stack comprising a gate dielectric in contact with the first material and a gate electrode in contact with the gate dielectric. The method comprises contacting the first material with a second material at a location adjacent to the gate stack, wherein the second material has a second composition, different than the first composition, and comprises oxygen and one or more metals. The method comprises forming source and drain contact metallization on opposite sides of the gate stack, the source and drain contact metallization in contact with the second material.

In eighteenth examples, for any of the seventeenth examples contacting the first material with the second material further comprises depositing a dielectric material over the first material, exposing a portion of the first material by patterning a via through the dielectric material, and depositing the second material into the via.

In nineteenth examples, for any of the seventeenth through eighteenth examples depositing the second material comprises at least one of physical vapor deposition, chemical vapor deposition, or atomic layer deposition.

In twentieth examples, for any of the seventeenth through nineteenth examples contacting the first material with the second material further comprises exposing a sidewall of the first material and depositing the second material onto the sidewall of the first material.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A transistor structure, comprising:
   a substrate material;
   a channel material of a first composition comprising oxygen and one or more metals, wherein the channel material is over the substrate material and has a lateral length comprising first and second portions separated by an intervening third portion of the channel material;
   a gate electrode over, and separated from the substrate material by, the third portion of the channel material;
   a gate dielectric material in direct contact with the third portion of the channel material, the gate dielectric material between the gate electrode and the third portion of the channel material;
   a source contact metallization coupled with the first portion of the channel material, wherein a first portion of a contact buffer material is between the first portion of the channel material and the source contact metallization; and
   a drain contact metallization coupled with the second portion of the channel material, wherein a second portion of the contact buffer material is between the second portion of the channel material and the drain contact metallization, and wherein the contact buffer material is of a second composition comprising oxygen and one or more metals.

2. The transistor structure of claim 1, wherein:
   the first, second and third portions of the channel material are substantially co-planar with each other;
   the source contact metallization is co-planar with the gate dielectric material; and
   the drain contact metallization is co-planar with the gate dielectric material.

3. The transistor structure of claim 1, wherein the contact buffer material comprises oxygen and at least one of In, Sn, Ir, Ti, Sb, Zn, or Al.

4. The transistor structure of claim 3, wherein the channel material and the contact buffer material both comprise In, and the contact buffer material has a greater atomic % of In than the channel material.

5. The transistor structure of claim 4, wherein the contact buffer material comprises at least one of In, Sn, Ir, or Ti.

6. The transistor structure of claim 4, wherein the contact buffer material comprises two or more of In, Sn, Ir, Ti, Sb, Zn, or Al.

7. The transistor structure of claim 6, wherein the contact buffer material comprises In and Sn.

8. The transistor structure of claim 1, wherein:
   the source contact metallization is in direct contact with the first portion of the contact buffer material and the first portion of the contact buffer material is in direct contact with the second portion of channel material; and
   the drain contact metallization is in direct contact with the second portion of the contact buffer material and the second portion of the contact buffer material is in direct contact with the third portion of channel material.

9. The transistor structure of claim 1, wherein the first and second portions of contact buffer material each comprise a liner laterally separating the source and drain contact metallization from the gate dielectric material.

10. An integrated circuit (IC) structure, comprising:
    a plurality of complementary metal-oxide-semiconductor (CMOS) field effect transistor (FET) structures, wherein individual ones of the CMOS FET structures comprise a Group IV crystalline material; and
    a plurality of back-end transistor structures over the CMOS FET structures, with one or more levels of interconnect metallization therebetween, wherein individual ones of the back-end transistor structures comprise:
    a channel material over the levels of interconnect metallization, the channel material of a first composition comprising oxygen and one or more metals, wherein the channel material has a lateral length comprising first and second portions separated by an intervening third portion of the channel material;
    a gate electrode over, and separated from the levels of interconnect metallization by, the third portion of the channel material;
    a gate dielectric material in direct contact with the third portion of the channel material, the gate dielectric material between the gate electrode and the third portion of the channel material;
    a source contact metallization coupled with the first portion of the channel material, wherein a first portion of a contact buffer material is between the first portion of the channel material and the source contact metallization; and
    a drain contact metallization coupled with the second portion of the channel material, wherein a second portion of the contact buffer material is between the second portion of the channel material and the drain contact metallization, and wherein the contact buffer material is of a second composition comprising oxygen and one or more metals.

11. The IC structure of claim 10, wherein:
    the channel material comprises a non-planar body of the first composition;
    a top surface of the first portion and the second portion of the contact buffer material is coplanar with a top surface of the non-planar body; and
    the first portion and the second portion of the contact buffer material are in direct contact with a sidewall of the non-planar body.

12. The IC structure of claim 11, wherein the first portion of the contact buffer material is adjacent to a sidewall of the source contact metallization and the top surface of the first portion of the contact buffer material is co-planar with a top surface of the source contact metallization, and wherein the second portion of the contact buffer material is adjacent to a sidewall of the drain contact metallization and the top surface of the second portion of the contact buffer material is co-planar with a top surface of the drain contact metallization.

13. A method of fabricating a transistor structure, the method comprising:
   forming a channel material over a substrate, wherein the channel material has a first composition comprising oxygen and one or more metals;
   forming a gate dielectric material in direct contact with a first portion of the channel material, wherein the first portion of the channel material is between a second and third portion of the channel material;
   forming a gate electrode over, and separated from the substrate by, the gate dielectric material and the first portion of the channel material;
   forming a first portion of a contact buffer material in direct contact with the second portion of the channel material, and a second portion of the contact buffer material in direct contact with the third portion of the channel material, wherein the contact buffer material has a second composition comprising oxygen and one or more metals;
   forming a source contact metallization in direct contact with the first portion of the contact buffer material; and
   forming a drain contact metallization in direct contact with the second portion of the contact buffer material.

14. The method of claim 13, wherein forming the source contact metallization and the drain contact metallization further comprises:
   depositing a second dielectric material over the contact buffer material;
   exposing the first and second portions of the contact buffer material by patterning vias through the second dielectric material;
   depositing the source contact metallization into a first of the vias; and
   depositing the drain contact metallization into a second of the vias.

15. The method of claim 14, wherein forming the first and second portions of the contact buffer material comprises at least one of physical vapor deposition, chemical vapor deposition, or atomic layer deposition.

16. The method of claim 15, wherein forming the first and second portions of the contact buffer material comprises depositing a compound of oxygen and at least one of In, Sn, Ir, Ti, Sb, Zn, or Al.

17. The method of claim 16, wherein:
   forming the channel material comprises depositing a compound of oxygen and at least In, and
   forming the contact buffer material comprises depositing a compound of oxygen and at least In at a greater atomic % of In than for the channel material.

18. The method of claim 16, wherein forming the contact buffer material comprises depositing a compound of In and Sn.

* * * * *